United States Patent
More et al.

(10) Patent No.: US 10,510,871 B1
(45) Date of Patent: Dec. 17, 2019

(54) SEMICONDUCTOR DEVICE AND METHOD

(71) Applicant: Taiwan Semiconductor Manufacturing Company, Ltd., Hsinchu (TW)

(72) Inventors: Shahaji B. More, Hsinchu (TW); Shih-Chieh Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/998,697

(22) Filed: Aug. 16, 2018

(51) Int. Cl.
| | | |
|---|---|---|
| *H01L 21/02* | (2006.01) | |
| *H01L 21/8234* | (2006.01) | |
| *H01L 21/04* | (2006.01) | |
| *H01L 29/66* | (2006.01) | |
| *H01L 29/417* | (2006.01) | |
| *H01L 29/78* | (2006.01) | |
| *H01L 29/06* | (2006.01) | |

(52) U.S. Cl.
CPC .. *H01L 29/66795* (2013.01); *H01L 21/02603* (2013.01); *H01L 21/0455* (2013.01); *H01L 21/823431* (2013.01); *H01L 29/0669* (2013.01); *H01L 29/41791* (2013.01); *H01L 29/7856* (2013.01); *H01L 2029/7858* (2013.01)

(58) Field of Classification Search
CPC .................................................. H01L 21/02603
See application file for complete search history.

(56) References Cited

U.S. PATENT DOCUMENTS

| | | | | | |
|---|---|---|---|---|---|
| 5,426,316 | A | * | 6/1995 | Mohammad | ........ H01L 29/7378 257/19 |
| 5,461,243 | A | * | 10/1995 | Ek | ..................... H01L 21/02381 257/12 |
| 5,461,250 | A | * | 10/1995 | Burghartz | ......... H01L 29/66742 257/192 |
| 5,920,088 | A | * | 7/1999 | Augusto | ........... H01L 21/82388 257/192 |

(Continued)

OTHER PUBLICATIONS

Tachi, K., et al., "Relationship between mobility and high-k interface propertieds in advanced Si and SiGe nanowires," Electron Devices Meeting (IEDM), 2009 IEEE International. 3 pages.

*Primary Examiner* — William A Harriston
(74) *Attorney, Agent, or Firm* — Slater Matsil, LLP

(57) ABSTRACT

Methods are disclosed for forming a multi-layer structure including highly controlled diffusion interfaces between alternating layers of different semiconductor materials. According to embodiments, during a deposition of semiconductor layers, the process is controlled to remain at low temperatures such that an inter-diffusion rate between the materials of the deposited layers is managed to provide diffusion interfaces with abrupt Si/SiGe interfaces. The highly controlled interfaces and first and second layers provide a multi-layer structure with improved etching selectivity. In an embodiment, a gate all-around (GAA) transistor is formed with horizontal nanowires (NWs) from the multi-layer structure with improved etching selectivity. In embodiments, horizontal NWs of a GAA transistor may be formed with substantially the same size diameters and silicon germanium (SiGe) NWs may be formed with "all-in-one" silicon (Si) caps.

20 Claims, 22 Drawing Sheets

(56) References Cited

U.S. PATENT DOCUMENTS

| | | | | |
|---|---|---|---|---|
| 6,313,016 | B1* | 11/2001 | Kibbel | C30B 23/02 |
| | | | | 257/E21.125 |
| 6,329,063 | B2* | 12/2001 | Lo | H01L 21/02381 |
| | | | | 257/E21.125 |
| 6,597,016 | B1* | 7/2003 | Yuki | H01L 21/26506 |
| | | | | 257/77 |
| 7,256,142 | B2* | 8/2007 | Fitzgerald | H01L 21/02381 |
| | | | | 257/E21.129 |
| 8,216,951 | B2* | 7/2012 | Cheng | B82Y 10/00 |
| | | | | 257/E21.353 |
| 9,818,872 | B2* | 11/2017 | Ching | H01L 29/0676 |
| 10,170,378 | B2* | 1/2019 | Doornbos | H01L 29/0657 |
| 2002/0125475 | A1* | 9/2002 | Chu | H01L 29/1025 |
| | | | | 257/55 |
| 2003/0139000 | A1* | 7/2003 | Bedell | H01L 21/02378 |
| | | | | 438/186 |
| 2004/0262636 | A1* | 12/2004 | Yang | B82Y 10/00 |
| | | | | 257/200 |
| 2008/0135949 | A1* | 6/2008 | Lo | B82Y 10/00 |
| | | | | 257/401 |
| 2011/0263098 | A1* | 10/2011 | Su | C23C 16/24 |
| | | | | 438/478 |
| 2014/0091279 | A1* | 4/2014 | Kachian | B82Y 10/00 |
| | | | | 257/27 |
| 2015/0179798 | A1* | 6/2015 | Clendenning | H01L 29/7851 |
| | | | | 257/401 |
| 2016/0336405 | A1* | 11/2016 | Sun | H01L 29/42392 |
| 2018/0033797 | A1* | 2/2018 | Colinge | H01L 29/42332 |

* cited by examiner

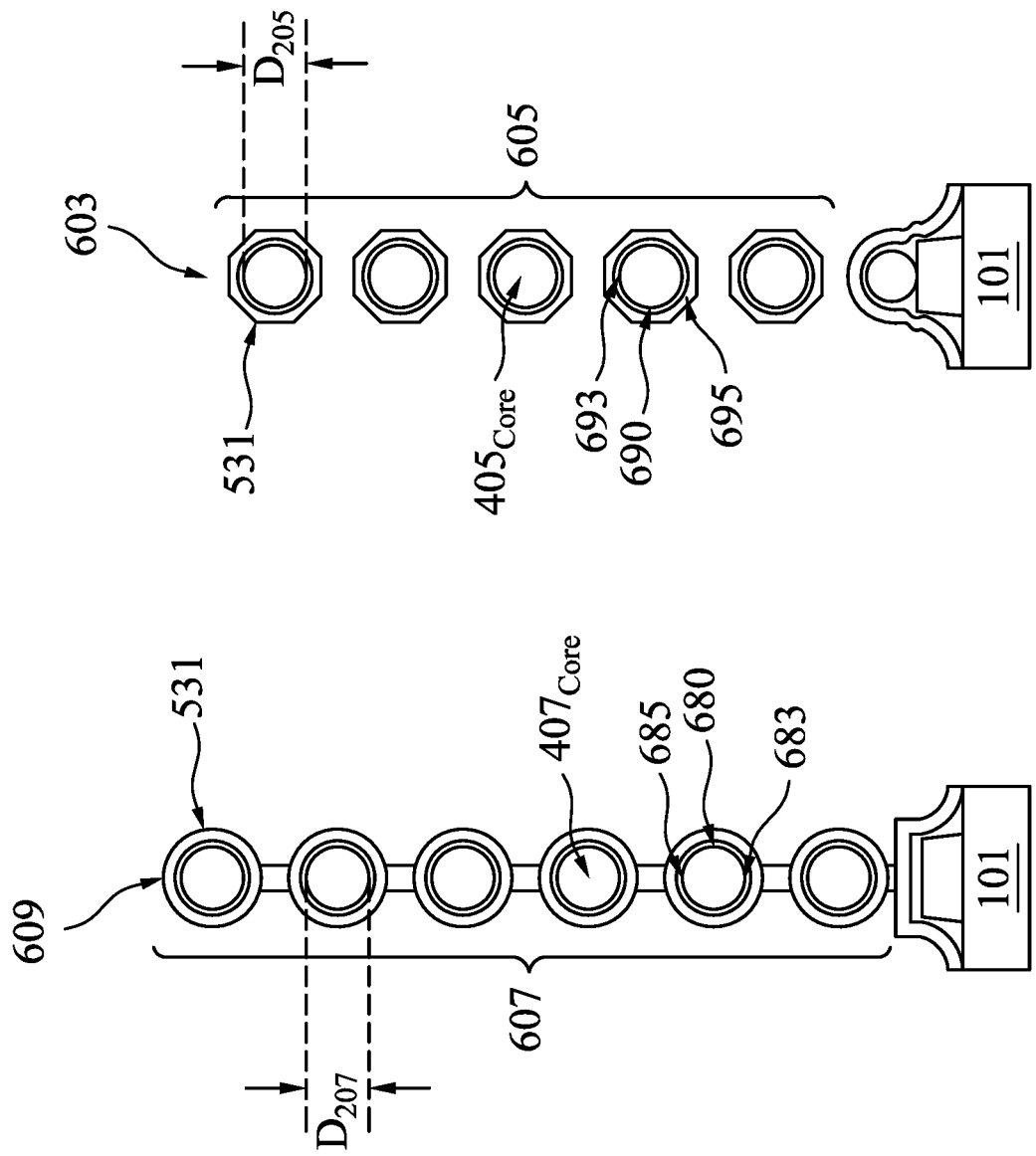

SEMICONDUCTOR DEVICE AND METHOD

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (finFETs) or multiple gate transistors are being researched and implemented. However, with continuous shrinking dimensions, even this new device structure faces new challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 illustrates a cross-sectional view of an intermediate stage of forming an NFET and a cross-sectional view of an intermediate stage of forming PFET in accordance with some embodiments.

DETAILED DESCRIPTION

Figure 1:
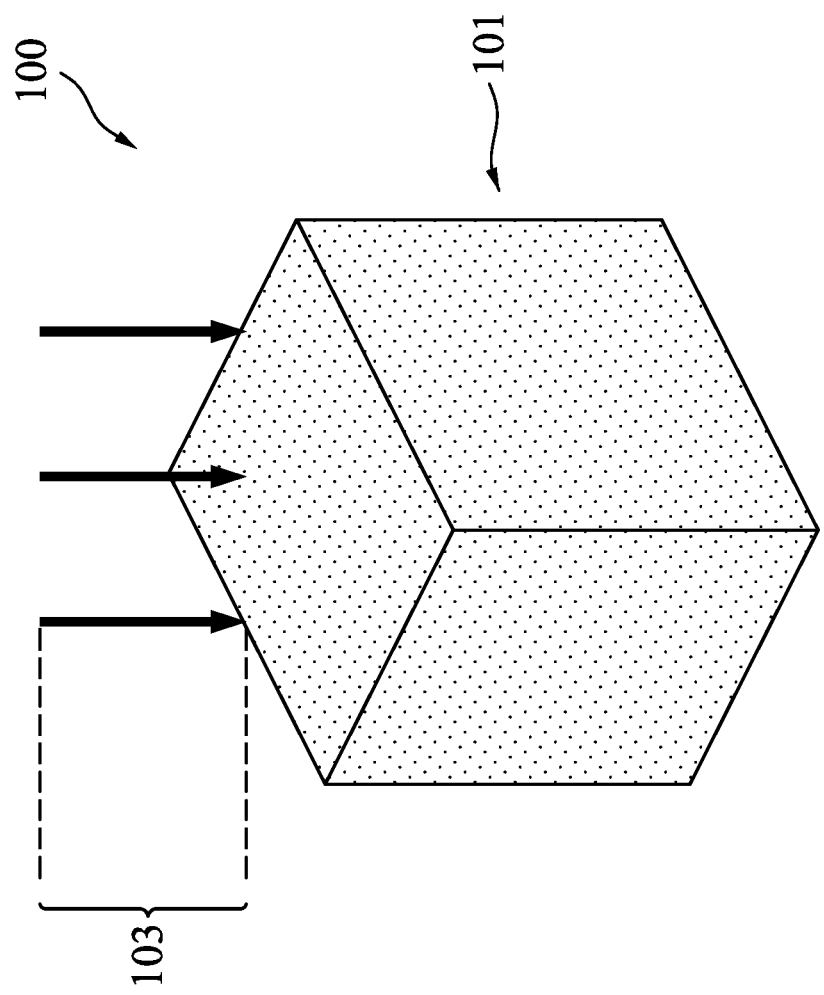
FIG. 1 illustrates an implant of dopants into a source material, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, this figure illustrates an Anti-Punch-Through (APT) implant of dopants into a source material 100, in accordance with some embodiments. The source material 100 may be in the form of a substrate 101, such as a semiconductor substrate, which may be, for example, a silicon substrate, a silicon germanium substrate, a germanium substrate, a III-V material substrate (e.g., GaAs, GaP, GaAsP, AlInAs, AlGaAs, GaInAs, InAs, GaInP, InP, InSb, and/or GaInAsP; or a combination thereof), or a substrate formed of other semiconductor materials with, for example, high band-to-band tunneling (BTBT). Substrate 101 may be doped or un-doped. The substrate 101 may be doped with a p-type or an n-type impurity. In some embodiments, substrate 101 may be a bulk semiconductor substrate, such as a bulk silicon substrate that is a wafer, a semiconductor-on-insulator (SOI) substrate, a multi-layered or gradient substrate, or the like.

A first implantation 103 (represented in FIG. 1 by arrows) is performed in order to implant first dopants into a first source region of substrate 101. In an embodiment, first dopants may be implanted, for example, for Anti-Punch-Through (APT) implant. However, any suitable implantation may be utilized.

Figure 2A:
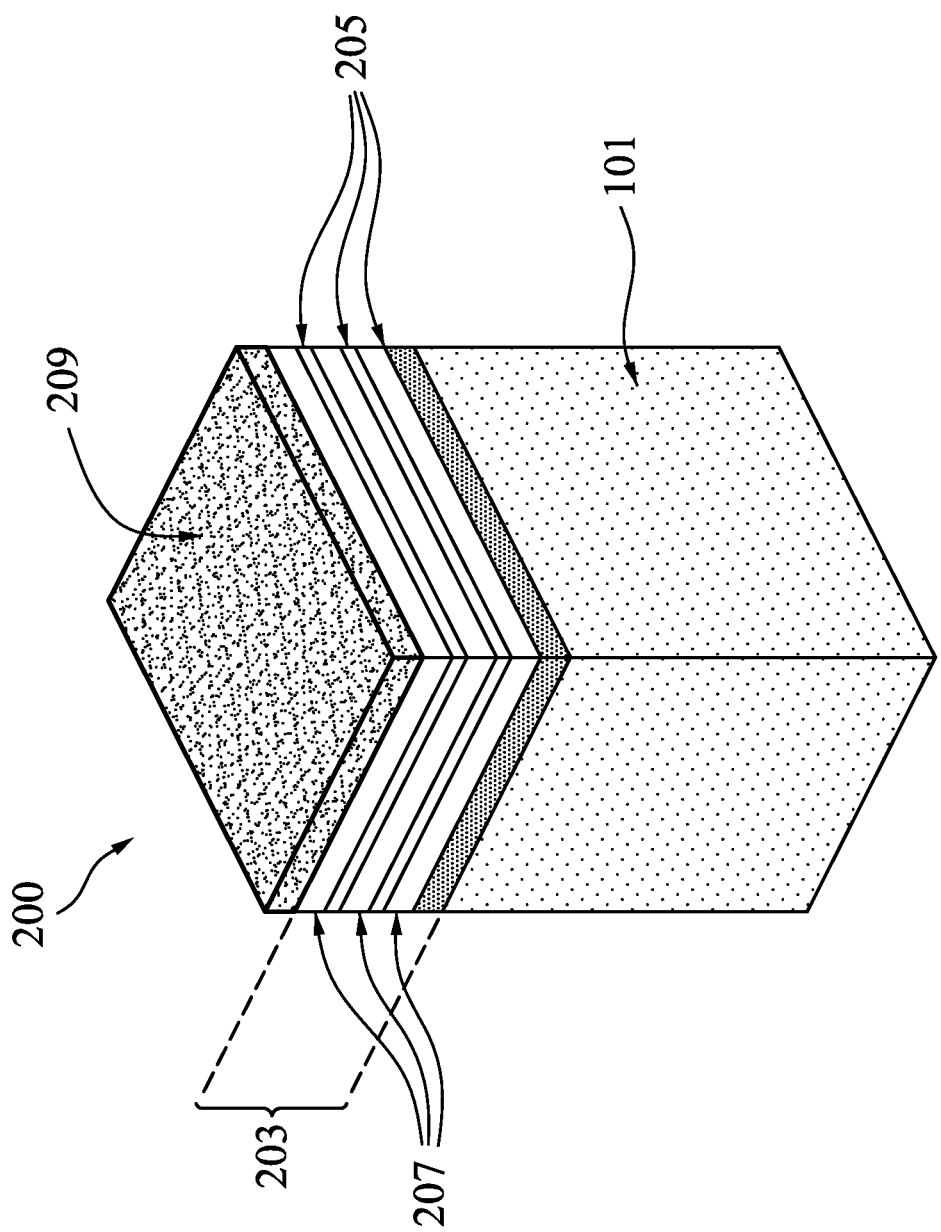
FIG. 2A illustrates a structure including a superlattice with a stack of alternating layers of semiconductor materials formed in accordance with some embodiments.

FIG. 2A is a three-dimensional (3D) view of a multi-layer structure 200 of an intermediate stage in the manufacturing of a Gate All-Around (GAA) transistor. In FIG. 2A, a superlattice 203 is formed on the substrate 101. Superlattice 203 includes alternating layers of first layers 205 (e.g., SiGe layers) of a first semiconductor material and second layers 207 (e.g., Si layers) of a second semiconductor material.

Each of the first layers 205 (e.g., SiGe layers) and the second layers 207 (e.g., Si layers), in some embodiments, is epitaxially grown on its underlying layer. The epitaxial growth can use CVD, MOCVD, MBE, LPE, VPE, UHVCVD, or the like, or a combination thereof. Each of the first layers 205 (e.g., SiGe layers) and the second layers 207 (e.g., Si layers) can be a group IV material, such as Si, Ge, SiGe, SiGeSn, SiC or the like; a group III-group V compound material, such as GaAs, GaP, GaAsP, AlInAs, AlGaAs, GaInAs, InAs, GaInP, InP, InSb, GaInAsP or the like. Superlattice 203 can include any number of the first layers 205 (e.g., SiGe layers) and any number of the second layers 207 (e.g., Si layers). As illustrated, for example, superlattice 203 has three first layers 205 (e.g., SiGe layers) and three second layers 207 (e.g., Si layers).

In some embodiments, the material of the first layers 205 is different from the material of the second layers 207. For example, the first layers 205 may be SiGe layers and the second layers 207 may be Si layers or SiC layers. Alternatively, for example, the first layers 205 may be Si layers or SiC layers and the second layers 207 may be SiGe layers. The difference in materials may allow for different strains and/or may allow for an etch selectivity between the first layers 205 and the second layers 207, as will be apparent below.

Figure 2B:
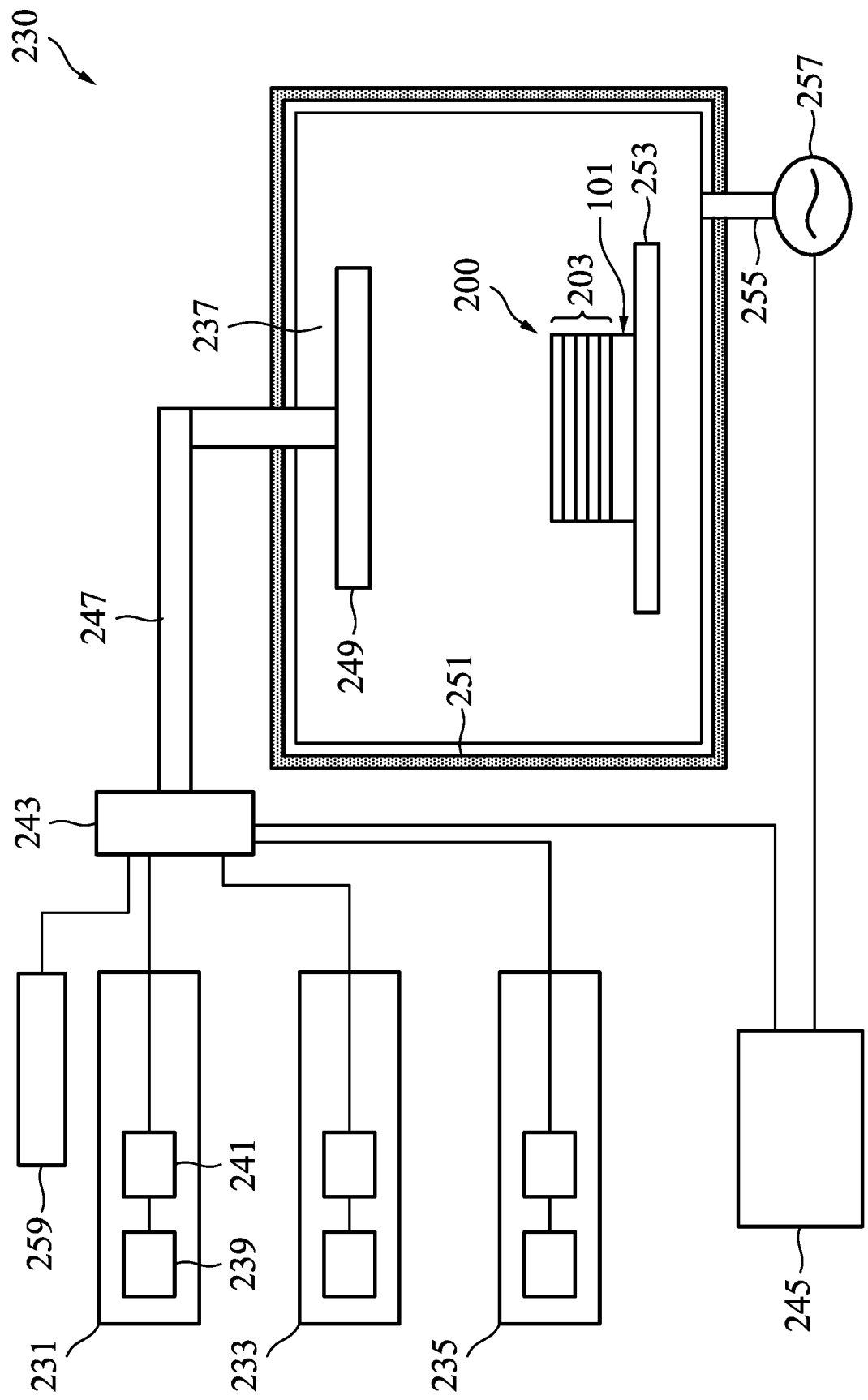
FIG. 2B illustrates a deposition chamber in accordance with some embodiments.
Figure 2C:
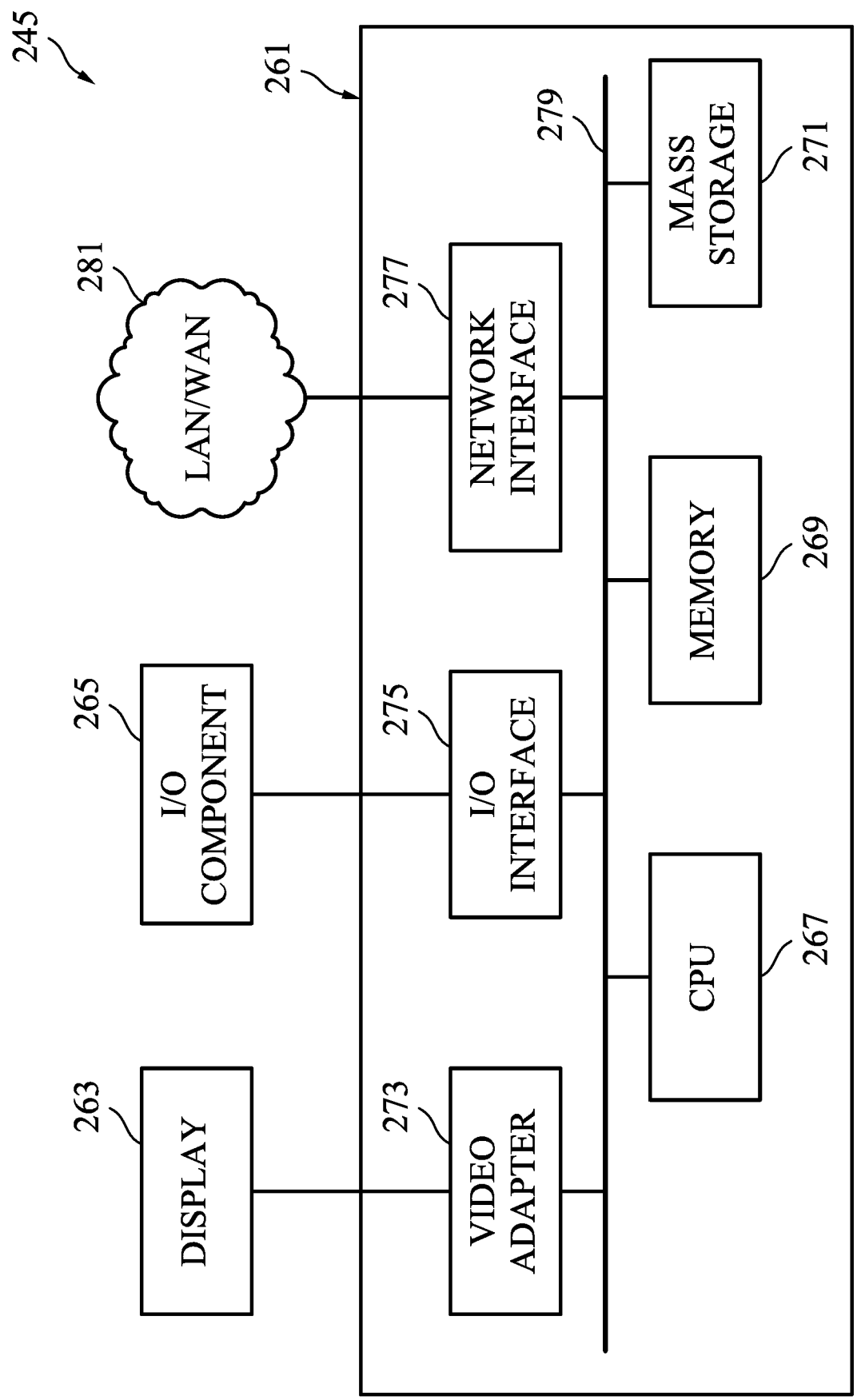
FIG. 2C illustrates a control unit for the deposition chamber of FIG. 2B in accordance with some embodiments.

FIGS. 2B and 2C illustrate a deposition system 230 that may be utilized to receive precursor materials from a first precursor delivery system 231, a second precursor delivery system 233, and a reactant delivery system 235 and form layers of materials onto the substrate 101 to form, for example, the multi-layer structure 200 shown in FIG. 2A. For example, first layers 205 (e.g., SiGe layers) and second layers 207 (e.g., Si layers) of the superlattice 203 are formed onto the substrate 101.

In an embodiment the first precursor delivery system 231, the second precursor delivery system 233, and the reactant delivery system 235 may work in conjunction with one another to supply the various different precursor materials to a deposition chamber 237 wherein the substrate 101 is placed. However, the first precursor delivery system 231, the second precursor delivery system 233, and the reactant delivery system 235 may have physical components that are similar with each other. For example, the first precursor delivery system 231, the second precursor delivery system 233, and the reactant delivery system 235 may each include a gas supply 239 and a flow controller 241 (labeled in FIG. 2B with regards to the first precursor delivery system 231 but not labeled for clarity with respect to the second precursor delivery system 233 or the reactant delivery system 235). In an embodiment in which the first precursor is stored in a gaseous state, the gas supply 239 may supply the first precursor to the deposition chamber 237. The gas supply 239 may be a vessel, such as a gas storage tank, that is located either locally to the deposition chamber 237 or else may be located remotely from the deposition chamber 237. Alternatively, the gas supply 239 may be a facility that independently prepares and delivers the first precursor to the flow controller 241. Any suitable source for the first precursor may be utilized as the gas supply 239, and all such sources are fully intended to be included within the scope of the embodiments.

The gas supply 239 may supply the desired precursor to the flow controller 241. The flow controller 241 may be utilized to control the flow of the precursor to a precursor gas controller 243 and, eventually, to the deposition chamber 237, thereby also helping to control the pressure within the deposition chamber 237. The flow controller 241 may be, e.g., a proportional valve, a modulating valve, a needle valve, a pressure regulator, a mass flow controller, combinations of these, or the like. However, any suitable method for controlling and regulating the flow of the first precursor may be utilized, and all such components and methods are fully intended to be included within the scope of the embodiments.

Additionally, in an embodiment in which the first precursor is stored in a solid or liquid state, the gas supply 239 may store a carrier gas and the carrier gas may be introduced into a precursor canister, which stores the first precursor in the solid or liquid state. The carrier gas is then used to push and carry the first precursor as it either evaporates or sublimates into a gaseous section of the precursor canister before being sent to the precursor gas controller 243. Any suitable method and combination of units may be utilized to provide the first precursor, and all such combination of units are fully intended to be included within the scope of the embodiments.

The first precursor delivery system 231, the second precursor delivery system 233, and the reactant delivery system 235 may supply their individual precursor materials into a precursor gas controller 243. The precursor gas controller 243 connects and isolates the first precursor delivery system 231, the second precursor delivery system 233, and the reactant delivery system 235 from the deposition chamber 237 in order to deliver the desired precursor materials to the deposition chamber 237. The precursor gas controller 243 may include such devices as valves, flow meters, sensors, and the like to control the delivery rates of each of the precursors and may be controlled by instructions received from a control unit 245 (described further below with respect to FIG. 2C).

The precursor gas controller 243, upon receiving instructions from the control unit 245, may open and close valves so as to connect one or more of the first precursor delivery system 231, the second precursor delivery system 233, and the reactant delivery system 235 to the deposition chamber 237 and direct a desired precursor material through a manifold 247, into the deposition chamber 237, and to a showerhead 249. In another embodiment, or in addition to, the desired precursor material may be directed to an injector unit (not shown). The injector unit may be formed, for example, from coiled tubing including a plurality of holes distributed throughout the tubing allowing for uniform dispersal of the precursor material in the deposition chamber 237. The showerhead 249 may be utilized to disperse the chosen precursor material(s) into the deposition chamber 237 and may be designed to evenly disperse the precursor material in order to minimize undesired process conditions that may arise from uneven dispersal. In an embodiment the showerhead 249 may have a circular design with openings dispersed evenly around the showerhead 249 to allow for the dispersal of the desired precursor material into the deposition chamber 237.

However, as one of ordinary skill in the art will recognize, the introduction of precursor materials to the deposition chamber 237 through a single showerhead 249 or through a single point of introduction as described above is intended to be illustrative only and is not intended to be limiting to the embodiments. Any number of separate and independent showerheads 249, injectors or other openings to introduce precursor materials into the deposition chamber 237 may alternatively be utilized. All such combinations of showerheads and other points of introduction are fully intended to be included within the scope of the embodiments.

The deposition chamber 237 may receive the desired precursor materials and expose the precursor materials to the substrate 101 or the superlattice 203, and the deposition chamber 237 may be any desired shape that may be suitable for dispersing the precursor materials and contacting the precursor materials with the substrate 101 or the superlattice 203. In the embodiment illustrated in FIG. 2B, the deposition chamber 237 has a cylindrical sidewall and a bottom. However, the deposition chamber 237 is not limited to a cylindrical shape, and any other suitable shape, such as a hollow square tube, an octagonal shape, or the like, may be utilized. Furthermore, the deposition chamber 237 may be surrounded by a housing 251 made of material that is inert to the various process materials. As such, while the housing 251 may be any suitable material that can withstand the chemistries and pressures involved in the deposition process, in an embodiment the housing 251 may be steel, stainless steel, nickel, aluminum, alloys of these, combinations of these, and like.

Within the deposition chamber 237 the substrate 101 may be placed on a mounting platform 253 in order to position and control the substrate 101 and/or the superlattice 203 during the deposition processes. The mounting platform 253 may include heating mechanisms in order to heat the substrate 101 during the deposition processes. In addition, the deposition chamber 237 may include heating elements and/or heating lamps configured to control the temperature of the deposition chamber 237 and the substrate 101 during the deposition processes. Furthermore, while a single mounting platform 253 is illustrated in FIG. 2B, any number of mounting platforms 253 may additionally be included within the deposition chamber 237.

Additionally, the deposition chamber 237 and the mounting platform 253 may be part of a cluster tool system (not shown). The cluster tool system may be used in conjunction with an automated handling system in order to position and place the substrate 101 into the deposition chamber 237 prior to the deposition processes, position, hold the substrate 101 during the deposition processes, and remove the substrate 101 from the deposition chamber 237 after the deposition processes.

A vacuum pump 257 may be connected to an exhaust outlet 255 of the deposition chamber 237 in order to help evacuate the exhaust gases. The exhaust outlet 255, under control of the control unit 245, may also be utilized to reduce and control the pressure within the deposition chamber 237 to a desired pressure and may also be utilized to evacuate precursor materials from the deposition chamber 237 in preparation for the introduction of the next precursor material.

FIG. 2C illustrates an embodiment of the control unit 245 that may be utilized to control the precursor gas controller 243 and the vacuum pump 257 (as illustrated in FIG. 2B). The control unit 245 may be any form of computer processor that can be used in an industrial setting for controlling process machines. In an embodiment the control unit 245 may comprise a processing unit 261, such as a desktop computer, a workstation, a laptop computer, or a dedicated unit customized for a particular application. The control unit 245 may be equipped with a display 263 and one or more input/output components 265, such as instruction outputs, sensor inputs, a mouse, a keyboard, printer, combinations of these, or the like. The processing unit 261 may include a central processing unit (CPU) 267, memory 269, a mass storage device 271, a video adapter 273, an I/O interface 275, and/or a network interface 277 connected to a bus 279.

The bus 279 may be one or more of any type of several bus architectures including a memory bus or memory controller, a peripheral bus, or video bus. The CPU 267 may comprise any type of electronic data processor, and the memory 269 may comprise any type of system memory, such as static random access memory (SRAM), dynamic random access memory (DRAM), or read-only memory (ROM). The mass storage device 271 may comprise any type of storage device configured to store data, programs, and other information and to make the data, programs, and other information accessible via the bus 279. The mass storage device 271 may comprise, for example, one or more of a hard disk drive, a magnetic disk drive, or an optical disk drive.

The video adapter 273 and the I/O interface 275 provide interfaces to couple external input and output devices to the processing unit 261. As illustrated in FIG. 2C, examples of input and output devices include the display 263 coupled to the video adapter 273 and the I/O component 265, such as a mouse, keyboard, printer, and the like, coupled to the I/O interface 275. Other devices may be coupled to the processing unit 261 and additional or fewer interface cards may be utilized. For example, a serial interface card (not shown) may be used to provide a serial interface for a printer.

The network interface 277 couples the processing unit 261 to external networks to facilitate network communications and to provide network access to external resources via one or more wired and/or wireless links 281 (e.g., local area network (LAN) and/or wide area network (WAN)). The network access and network communications may use one or more circuit switched networks and/or packet switched networks. In an embodiment the control unit 245 may be a system that is locally connected via one or more wired and/or wireless connections to the precursor gas controller 243 and vacuum pump 257. In an embodiment the control unit 245 may be a system that is remote from the precursor gas controller 243 and/or vacuum pump 257 and may connect and control the precursor gas controller 243 and vacuum pump 257 via a remote wired and/or wireless connection. In an embodiment, the control unit 245 may be a distributed system comprising one or more processing units 261 of one or more network servers and/or may employ one or more network services via for controlling the precursor gas controller 243 and vacuum pump 257.

It should be noted that the control unit 245 may include other components. For example, the control unit 245 may include power supplies, cables, a motherboard, removable storage media, cases, and the like. These other components, although not shown in FIG. 2C, are considered part of the control unit 245.

Figure 2D:
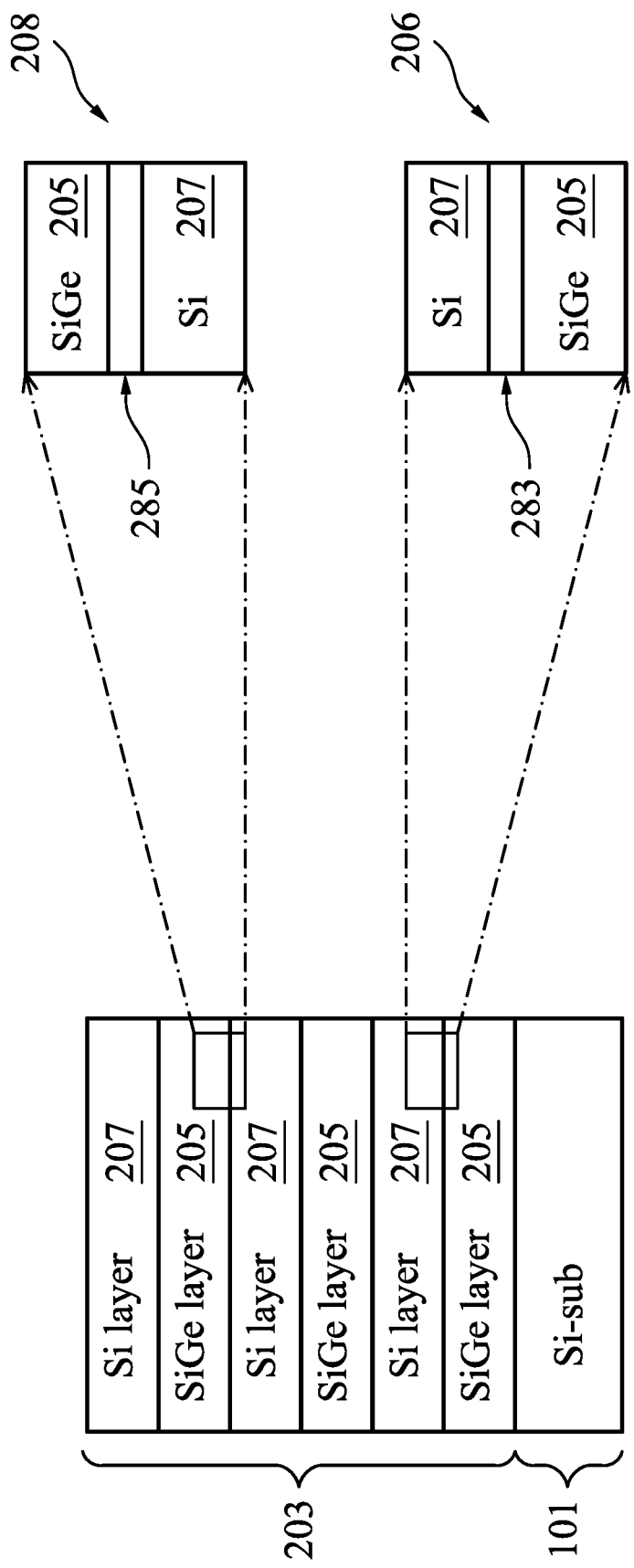
FIG. 2D illustrates cross-sectional views of first and second sections showing more details of areas between different layers of the stack in accordance with some embodiments.

FIG. 2D illustrates details of the superlattice 203 and the substrate 101, as shown in the previous figures and as previously described. The following discussion is directed towards an example of forming layers of materials (e.g., superlattice 203 including first layers 205 and second layers 207) onto a substrate (e.g., substrate 101) within a deposition system (e.g., deposition system 230) with references to FIGS. 2B and 2D. FIG. 2D illustrates an example of the layers of materials formed on a substrate and should in no way be considered limiting. For example, the ordering of layers, number of layers, relative thicknesses, sizes and/or materials of the layers as illustrated should in no way be limiting but rather are illustrated as an example to aid in the following discussion.

Continuing with FIG. 2D, the first layer 205 may be deposited onto the substrate 101 utilizing the deposition system 230. In an embodiment the formation of the first layer 205 may be initiated by putting a first precursor material into the first precursor delivery system 231. For example, in an embodiment in which the first layer 205 is desired to be a material such as silicon germanium (SiGe), the first precursor material may be a silane based precursor material, such as silicore ($Si_3H_8$), dichlorosilane (DCS), trichlorosilane (TCS), disilane, or silane.

Additionally, a second precursor material may be placed into the second precursor delivery system 233. In an embodiment in which the first layer 205 is silicon germanium (SiGe), the second precursor material is a germanium precursor material, such as $Ge_2Cl_2H_6$ or $GeH_4$. In other embodiments, the first precursor material may be a germanium precursor material (e.g., $Ge_2Cl_2H_6$, $GeH_4$) and the second precursor material may be a silane based precursor material (e.g., silicore ($Si_3H_8$), DCS, TCS, disilane, silane). Furthermore, a reactive gas (or reactive material) may be placed into the reactant delivery system 235. In an embodiment the reactive gas may be an etchant precursor, such as HCl or CL, and the carrier gas may be a carrier gas such as $H_2$, He, or $N_2$ that are utilized to help shape the layers during deposition and/or improve the reaction rates of the other precursors.

Once the first precursor material, the second precursor material, and the reactant material have been placed into the first precursor delivery system 231, the second precursor delivery system 233, and the reactant delivery system 235, respectively, the formation of the first layer 205 may be initiated by the control unit 245 sending an instruction to the precursor gas controller 243 to connect the first precursor delivery system 231, the second precursor delivery system 233, and the reactant delivery system 235 to the deposition chamber 237. Once connected, the first precursor delivery system 231, the second precursor delivery system 233, and the reactant delivery system 235 can deliver the first precursor material, the second precursor material, and the reactant material to the showerhead 249 through the precursor gas controller 243 and the manifold 247. Under control of the control unit 245, radicals of the precursor materials may be disassociated using a suitable process, for example, using a plasma generation unit or remote plasma unit (not shown). However, any appropriate method may be used to disassociate the radicals of the precursor materials. Once disassociated, the showerhead 249 and/or injectors (not shown) can then disperse the first precursor material, the second precursor material, and the reactant material into the deposition chamber 237, wherein the first precursor material, the second precursor material, and the reactant material can be adsorbed and react with each other to form the first layer 205 (e.g., SiGe layer of superlattice 203) on the substrate 101.

In an embodiment, as illustrated in FIG. 2D, to form the first layer 205 (e.g., SiGe), the first precursor material may be flowed into the deposition chamber 237 at a flow rate of between about 10 sccm and about 1000 sccm, such as about 300 sccm, the second precursor material may be flowed into the deposition chamber 237 at a flow rate of between about 10 sccm and about 1000 sccm, such as about 700 sccm, and the reactant material may be flowed into the deposition chamber at a flow rate of between about 10 sccm and about 1000 sccm, such as about 200 sccm. Additionally, the deposition chamber 237 may be held at a pressure of between about 5 torr and about 600 torr, such as about 10 torr, and a temperature of less than about 600° C., such as between about 350° C. and about 600° C. In some embodiments, using an isothermal process temperature allows for maintaining control of the diffusion interfaces. For example, in some embodiments, the deposition process may be controlled during the deposition of a first layer such that a first temperature is maintained (e.g., between about 650° C. and about 680° C.) during the deposition of the first precursor material and the second precursor material for a first layer. The deposition process may be controlled during the deposition of a second layer such that a second temperature is maintained (e.g., at or below 620° C.) during the deposition of the first precursor material and the second precursor material. As the second layer is deposited over the first layer and the materials of the second layer and first layer diffuse into the first layer or second layer, the second temperature is maintained to better control the rate of diffusion between the materials at a desired rate of diffusion and the thickness of the diffusion interface. For example, a Si/SiGe diffusion interface may be controlled to a thickness between about 0.5 nm to about 1.5 nm. Moreover, the deposition process for depositing the alternating layers of semiconductor materials is controlled such that the percentage concentration of one or more elements of a semiconductor material being formed is better controlled. In an embodiment, the process is controlled such that an SiGe layer has a percent concentration Ge (Ge %) within a range for example, 20% to 60% Ge. Furthermore, the process may be controlled such that the first layer 205 has a thickness, for example, between 3 nm and 15 nm, inclusive. However, as one of ordinary skill in the art will recognize, these process conditions are only intended to be illustrative, as any suitable process conditions may be utilized while remaining within the scope of the embodiments.

In an embodiment, after the first layer 205 has been formed to a desired thickness, an optional purging process may be performed to purge the deposition chamber 237 of any remaining precursor materials and/or reactant materials. In other embodiments, before each first layer 205 is deposited, for example, after another layer (e.g., second layer 207) has been deposited over the first layer 205, the optional purging process may be performed to purge the deposition chamber 237. In other embodiments, the optional purging process may not be performed.

In some embodiments for performing the optional purging process, the precursor gas controller 243 may be configured to connect and isolate a purge gas delivery system 259 to deliver a purge gas to the deposition chamber 237 in order to purge the deposition chamber 237 of any precursor materials and/or reactant materials from the deposition chamber 237. The control unit 245 may instruct the precursor gas controller 243 to disconnect one or more of the first precursor delivery system 231 and second precursor delivery system 233 and/or the reactant delivery system 235 (containing the precursor and/or reactant materials to be purged from the deposition chamber 237) and to connect the purge gas delivery system 259 to deliver a purge gas to the deposition chamber 237. In an embodiment the purge gas delivery system 259 may be a gaseous tank or other facility that provides a purge gas such as nitrogen, argon, xenon, or other non-reactive gas to the deposition chamber 237. Additionally, the control unit 245 may also initiate the vacuum pump 257 in order to apply a pressure differential to the deposition chamber 237 to aid in the removal of any remaining materials (e.g., first and second precursor materials and/or reactant material) to be purged from the deposition chamber 237. The purge gas, along with the vacuum pump 257, may purge the deposition chamber 237 for about 3 seconds.

In an embodiment, after the first layer 205 has been deposited onto the substrate 101, the formation of the second layer 207 may be initiated by the control unit 245 sending an instruction to the precursor gas controller 243 to connect the first precursor delivery system 231 and the reactant delivery system 235 to the deposition chamber 237. Once connected, the first precursor delivery system 231 and the reactant delivery system 235 can deliver the first precursor material and the reactant material to the showerhead 249 through the precursor gas controller 243 and the manifold 247. Under control of the control unit 245, the showerhead 249 can then disperse the first precursor material and the reactant material into the deposition chamber 237, wherein the first precursor material and the reactant material can be adsorbed and react with each other to form the second layer 207 on the first layer 205, previously formed on the substrate 101.

In an embodiment, as further illustrated in FIG. 2D, to form the second layer 207 (e.g., Si layer), the first precursor material may be flowed into the deposition chamber 237 at a flow rate of between about 10 sccm and about 1000 sccm, such as about 500 sccm, and the reactant material may be flowed into the deposition chamber 237 at a flow rate of between about 10 sccm and about 1000 sccm, such as about 150 sccm. Additionally, the deposition chamber 237 may be held at a pressure of between about 5 torr and about 600 torr, such as about 10 torr. However, as one of ordinary skill in the art will recognize, these process conditions are only intended to be illustrative, as any suitable process conditions may be utilized while remaining within the scope of the embodiments. In an embodiment, after a second layer 207 (e.g., Si layer) has been deposited, the optional purge process may be performed and in other embodiments, the optional purge process may not be performed.

Continuing with the example illustrated in FIG. 2D, the formation of layers may progress under control of the control unit 245 such that the superlattice 203 may be formed with alternating layers of the first layers 205 (e.g., SiGe layers) and second layers 207 (e.g., Si layers) formed on the substrate 101. In an embodiment, a next layer is formed on a topmost previously formed layer, wherein the topmost previously formed layer is, for example, one of the first layer 205 and the second layer 207 (e.g., Si layer) and the next layer is, for example, the other one of the first layer 205 and the second layer 207 (e.g., Si layer). The formation of the next layer may be initiated by the control unit 245 sending an instruction to the precursor gas controller 243 to connect the appropriate ones of the first precursor delivery system 231, the second precursor delivery system 233, and the reactant delivery system 235 to the deposition chamber 237. Once connected, the appropriate ones of the first precursor delivery system 231, the second precursor delivery system 233, and the reactant delivery system 235 can deliver one or more of the first precursor material, the second precursor material, and the reactant material to the showerhead 249 through the precursor gas controller 243 and the manifold 247. Under control of the control unit 245, the showerhead 249 can then disperse the appropriate ones of the one or more of the first precursor material, the second precursor material, and the reactant material into the deposition chamber 237, wherein appropriate ones and suitable concentrations of the first precursor material, the second precursor material, and the reactant material can be adsorbed and react with each other to form a next layer (e.g., one of the first layer 205 and the second layer 207) on a previously formed layer (e.g., other one of the first layer 205 and the second layer 207).

In a particular embodiment, the deposition process may be controlled, for example, such that the second layer 207 has a constant thickness, for example, between 3 nm and 15 nm, inclusive. Furthermore, the control unit 245 may control the temperature of the deposition chamber during the deposition process to be between a temperature of 350° C.-600° C. and further control the temperatures and percentage concentrations of the precursor materials for certain periods of time.

In an embodiment, the formation of the first layers 205 (e.g., SiGe layers) and the second layers 207 (e.g., Si layers) of the superlattice 203 may progress under control of the control unit 245 until a desired number of layers is formed on the substrate 101, for example, from 1 layers to 6 layers, such as 4 layers. In an embodiment, three first layers 205 (e.g., SiGe layers) and three second layers 207 (e.g., Si layers) may be formed on the substrate 101, in the alternating fashion described above, resulting in the structure illustrated in FIG. 2D. Although not specifically shown, it is to be understood that that the first layers 205 may be any suitable semiconductor material and the second layers 207 may be any other suitable material (e.g., SiGe). It is also to be understood that any number of desired layers (e.g., the first layers 205 and the second layers 207) may be formed on the substrate 101.

FIG. 2D further illustrates a first section 206 of the superlattice 203 including a first diffusion interface 283 formed between the first layer 205 and the second layer 207 (e.g., Si layer). In an embodiment, the first diffusion interface 283 is formed during the process of depositing the second layer 207 on the first layer 205 (e.g., SiGe layer). In addition, FIG. 2D illustrates a second section 208 of the superlattice 203 including a second diffusion interface 285 formed between the first layer 205 and the second layer 207. In an embodiment, the second diffusion interface 285 is formed during the process of depositing the first layer 205 (e.g., SiGe layer) on the second layer 207 (e.g., Si layer). The first diffusion interface 283 of the first section 206 and the second diffusion interface 285 of the second section 208 will be discussed in greater detail, below.

Figure 2E:
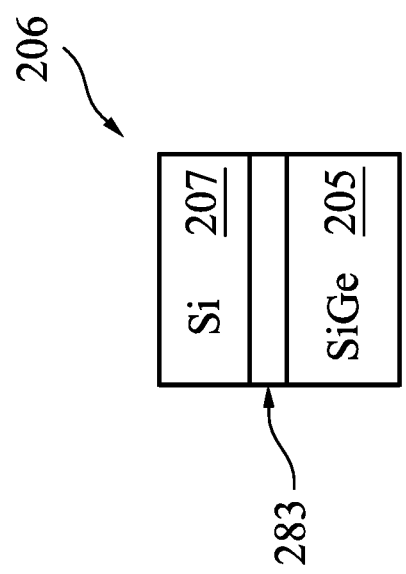
FIG. 2E illustrates a first diffusion interface formed between two of the alternating layers of semiconductor materials formed in accordance with some embodiments.

FIG. 2E illustrates in more detail the first section 206 of the superlattice 203 (as shown in FIG. 2D). In an embodiment, the first section 206 includes the first layer 205 (e.g., SiGe layer) formed in a manner as described above. In an embodiment, the first layer 205 (e.g., SiGe layer) may be formed to have a constant percentage of germanium (Ge %) between about 10% and about 60% or about 50%. In other embodiments, the Ge % of the first layer 205 may have a gradient. First section 206 further includes the second layer 207 (e.g., Si layer) formed in a manner as described above.

In addition, the first section 206 includes a first diffusion interface 283 that is disposed between an upper portion of the first layer 205 and a lower portion of the second layer 207 and is formed as a diffusion layer between the upper portion of the first layer 205 (e.g., SiGe layer) and the lower portion of the second layer 207 (e.g., Si layer), during the deposition of the second layer 207 on the first layer 205, as discussed above. In an embodiment, the deposition process is controlled (e.g., using a temperature less than 600° C.) so that the first diffusion interface 283 is formed to have a thickness (e.g., Si/SiGe abruptness) that is greater than zero and less than about 2 nm, such as less than about mm, or less than about 0.96 nm. In an embodiment, the first diffusion interface 283 is formed to have a gradient percentage of Ge % between about 50% at the upper portion of the first layer 205 (e.g., SiGe layer) and about 0% Ge at the lower portion of the second layer 207 (e.g., Si layer). In an embodiment, the first diffusion interface 283 of the first section 206 (e.g., $Si_{0.5}Ge_{0.5}/Si_xGe_{1-x}/Si$) may have a material composition that transitions from the first layer 205 (e.g., $Si_{0.5}Ge_{0.5}$), through the first diffusion interface 283 (e.g., $Si_xGe_{1-x}$), to the second layer 207 (e.g., Si). According to this embodiment, $Si_{0.5}Ge_{0.5}$ represents a material composition ratio of the first layer 205 being 50% silicon and 50% germanium, $Si_xGe_{1-x}$ represents the composition ratio of the first diffusion interface 283 being 100x % silicon and 100(1−x) % germanium, with x going from 0.5 to 1 as the $Si_xGe_{1-x}$ first diffusion interface 283 transitions from the first layer 205 toward the second layer 207, and Si represents the composition ratio of the second layer 207 being 100% silicon. However, any suitable range may be utilized.

Additionally, in some embodiments the thickness of the first layer 205 may be the same as the thickness of the second layer 207, for a thickness ratio of 1:1. In other embodiments thickness of the second layer 207 may be different to the thickness of the first layer 205. For example, in other embodiments the Si:SiGe thickness ratio may be 1:1, 1:1.2, or 0.8:1, 2:1, 2:1.2, 1.8:1, 1.2:1, 1.2:0.8, 1.2:1, 1.2:0.8, or 1.2:1. Additionally, each separate second layers 207 may have a different thickness than the other second layers 207, and all such combinations of ratios may be utilized.

Figure 2F:
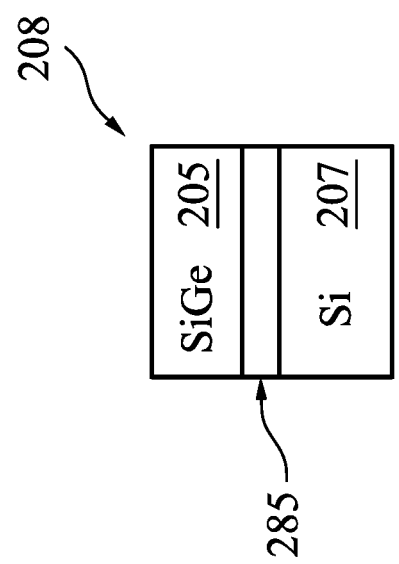
FIG. 2F illustrates a second diffusion interface formed between two of the alternating layers of semiconductor materials formed in accordance with some embodiments.

FIG. 2F illustrates in more detail the second section 208 of the superlattice 203 (as shown in FIG. 2D). In an embodiment, the second section 208 includes the second layer 207 (e.g., Si layer) formed in a manner, as described above, and is formed to have a thickness of between about 4 nm and about 20 nm, such as about 8 nm. Second section 208 further includes a first layer 205 (e.g., SiGe layer) formed in a manner, as described above, and is formed to have a thickness of between about 4 nm and about 20 nm, such as about 8 nm. In an embodiment, the first layer 205 (e.g., SiGe layer) may have a constant percentage Ge % between about 10% and about 60% or about 50%. In other embodiments, the percentage Ge % of the first layer 205 may have a gradient.

In addition, the second section 208 includes the second diffusion interface 285 (e.g., second diffusion interface 285 of FIG. 2D) that is disposed between an upper portion of the second layer 207 (e.g., Si layer) and a lower portion of the first layer 205 and is formed as a diffusion layer between the upper portion of the second layer 207 (e.g., Si layer) and the lower portion of the first layer 205 (e.g., SiGe layer), during the deposition of the first layer 205 on the second layer 207, as discussed above. In an embodiment, the deposition process is controlled such that the second diffusion interface 285 is formed to have a thickness (e.g., Si/SiGe abruptness) of less than about 2 nm, such as less than about 1 nm, or less than about 0.96 nm. In an embodiment, the second diffusion interface 285 is formed to have a gradient percentage Ge % about 0% Ge at the upper portion of the second layer 207 (e.g., Si layer) and between about 10% and about 60% or about 50% Ge at the lower portion of the first layer 205 (e.g., SiGe layer). In an embodiment, the second diffusion interface 285 of the second section 208 (e.g., $Si/Si_xGe_{1-x}/Si_{0.5}Ge_{0.5}$) may have a material composition that transitions from the second layer 207 (e.g., Si), through the second diffusion interface 285 (e.g., $Si_xGe_{1-x}$), to the first layer 205 (e.g., $Si_{0.5}Ge_{0.5}$). According to this embodiment, Si represents the composition ratio of the second layer 207 being 100% silicon, $Si_xGe_{1-x}$ represents the composition ratio of the second diffusion interface 285 being 100x % silicon and 100(1−x) % germanium, as the $Si_xGe_{1-x}$ second diffusion interface 285 transitions from the second layer 207 to the first layer 205 with x going from 1 to 0.5, and $Si_{0.5}Ge_{0.5}$ represents a material composition ratio of the first layer 205 being 50% silicon and 50% germanium.

In some embodiments, after the superlattice 203 has been formed to a desired height and/or formed to a desired number of layers, one or more other optional processes may be performed. In some other embodiments, none of the optional processes may be performed.

Returning to FIG. 2A, in an embodiment, the superlattice 203 of the desired height and/or number of layers may be subject to a hardmask layer 209 deposition. The hardmask layer 209 may be deposited over the topmost surface of the superlattice 203, as shown in FIG. 2A. In an embodiment, the hardmask layer 209 may be formed using a deposition process in the deposition chamber or may use any other suitable process of forming the hardmask layer 209 above the superlattice 203. The hardmask material 209 may be formed from any suitable hardmask materials, such as silicon nitride, although any suitable material may be used.

In an embodiment, the superlattice 203 of the desired height and/or number of layers may be subject to an optional rapid thermal annealing (RTA) process in order to stabilize the pre-surface atom granulation over the next layer and to remove a non-crystalline region that is present at the interface. In an embodiment, the RTA may be in-situ and isothermal or isobaric such that the temperature of the deposition chamber 237 during the RTA process may be controlled to remain either the same as or different from the temperature during the deposition process, such as being within the same range of temperatures as the deposition process, such as by being between 250° C. and 550° C., such as 300-500° C. for a period of 200-500 seconds, inclusive. However, any suitable anneal process may be utilized.

By keeping the RTA temperature between 250° C. and 550° C., the non-crystalline region at the interface can be better controlled or even removed. In particular, at higher temperatures (e.g., greater than about 600° C.), the interface is not abrupt and there is a loose uniformity within the wafers. Further, at lower temperatures (e.g., less than about 200° C. or at room temperature), the interface may generate defects due to the non-crystalline region. However, by keeping the temperature between about 250° C. and 500° C., the non-crystalline region may be reduced or even removed without the generation of defects.

Additionally, the time period of 200-500 seconds is utilized to help remove the non-crystalline region at the interface. For example, if the RTA duration is less than about 200 seconds, the process is not able to completely remove the defects, thereby leaving the defects within the material. Further, if the RTA duration is longer than 500 seconds, the RTA can generate undesired stresses in the superlattice 203 and could reduce device performance.

The forgoing discussion describes a process for forming the multi-layer structure 200 of an intermediate step in forming a GAA transistor, as shown in FIG. 2A. In an embodiment, the highly controlled first diffusion interface 283 disposed between the upper portion of the first layer 205 and lower portion of the second layer 207 (e.g., Si layer) in the first section 206 and the highly controlled second diffusion interface 285 disposed between the upper portion of the second layer 207 (e.g., Si layer) and the lower portion of the first layer 205 in the second section 208 of the multi-layered structure 200, provide improved etching selectivity of the multi-layer structure 200. In one embodiment, the multi-layer structure 200 with improved etching selectivity enables the formation of horizontal GAA NWs having substantially same diameters. These benefits and other advantages will be discussed in greater detail and will become apparent in the following description of forming the GAA transistor from the multi-layer structure 200 with respect to the remaining Figures.

Figure 3A:
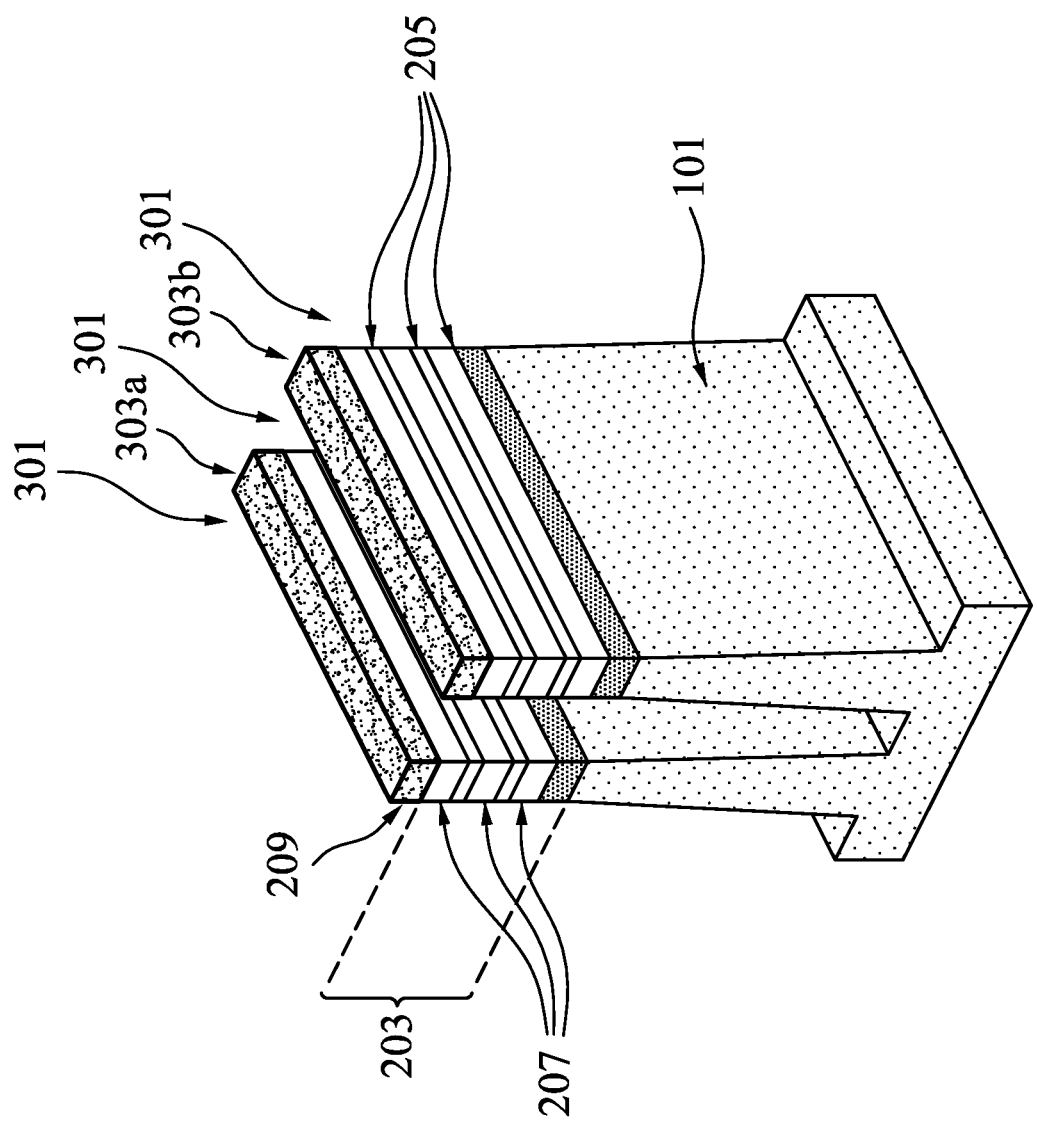
FIGS. 3A-3C illustrate various cross-sectional and perspective views of intermediate stages of patterning the stack of alternating layers of semiconductor materials in accordance with some embodiments.

FIG. 3A illustrates an embodiment of a patterning process that is performed to form trenches 301 in the multi-layer structure 200, after the hardmask layer 209 has deposited on the top surface of the multi-layer structure 200 (as shown in FIG. 2A). In some embodiments, photolithography techniques are utilized to pattern the hardmask layer 209. Generally, a photoresist material (not shown) is deposited over the hardmask layer 209. The photoresist material is irradiated (exposed) with radiation, e.g. light, through a patterned reticle in order to induce a reaction in those portions of the photoresist material exposed to the energy. The photoresist material is developed to remove a portion of the photoresist material, wherein the remaining photoresist material protects the underlying material from subsequent processing steps, such as etching.

In FIG. 3A, after the etching process is performed to the multi-layered structure 200, remaining regions of the superlattice 203 and the underlying substrate 101 form fins, such as a first fin 303a and a second fin 303b (collectively referred to as fins 303). As can be seen in FIG. 3A, the fins 303 comprise portions of the superlattice 203 (e.g., portions of the first layers 205 (e.g., SiGe layers) and portions of the second layers 207 (e.g., Si layers)), and portions of the substrate 101. As discussed in greater detail below, the fins 303 will be used to form horizontal nanowires (NWs) for one or more of an n-type FinFET and/or a p-type FinFET. Although two fins (i.e., first fin 303a and second fin 303b) are shown in FIG. 3A, it is to be understood that any suitable number and type of fins may be utilized.

Figure 3B:
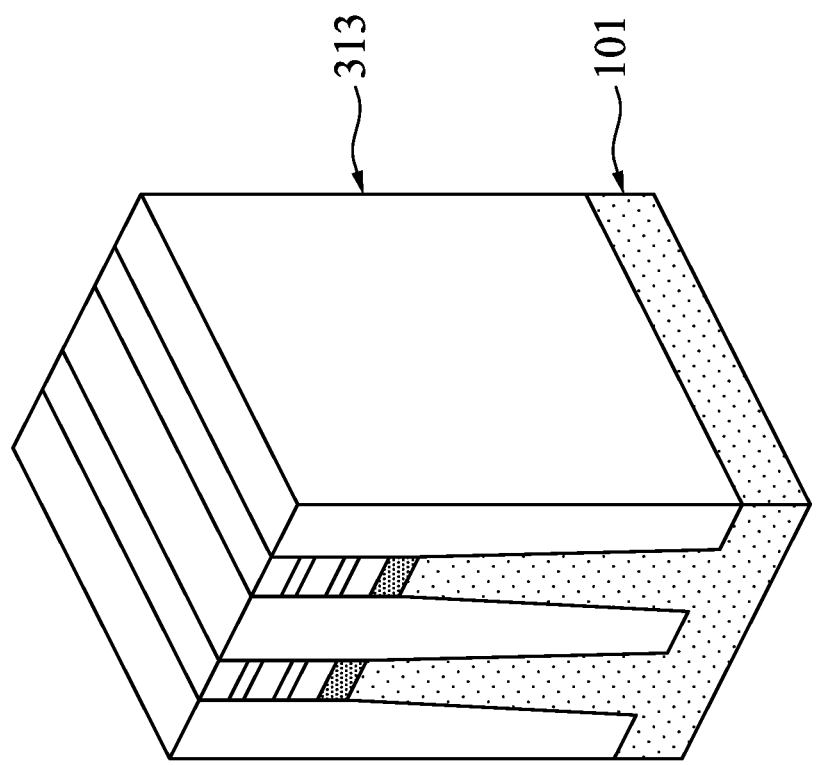

FIG. 3B illustrates the formation of shallow trench isolations (STIs) 313, in accordance with some embodiments. In FIG. 3B, a dielectric insulating material is deposited in the trenches 301 between adjacent fins 303 to form STIs 313. The STIs 313 may be made of suitable dielectric materials such as silicon oxide, silicon nitride, silicon oxynitride, fluoride-doped silicate glass (FSG), low-k dielectrics such as carbon doped oxides, extremely low-k dielectrics such as porous carbon doped silicon dioxide, a polymer such as polyimide, combinations of these, or the like. In some embodiments, the STIs 313 are formed through a process such as CVD, flowable CVD (FCVD), or a spin-on-glass process, although any acceptable process may be utilized. Subsequently, the STIs 313 may be subject to one or more of a hardmask removal process and a process for removal of portions of the STIs 313 extending over the top surfaces of the fins 303 using, for example, an etch process, chemical mechanical polishing (CMP), or the like.

Figure 3C:
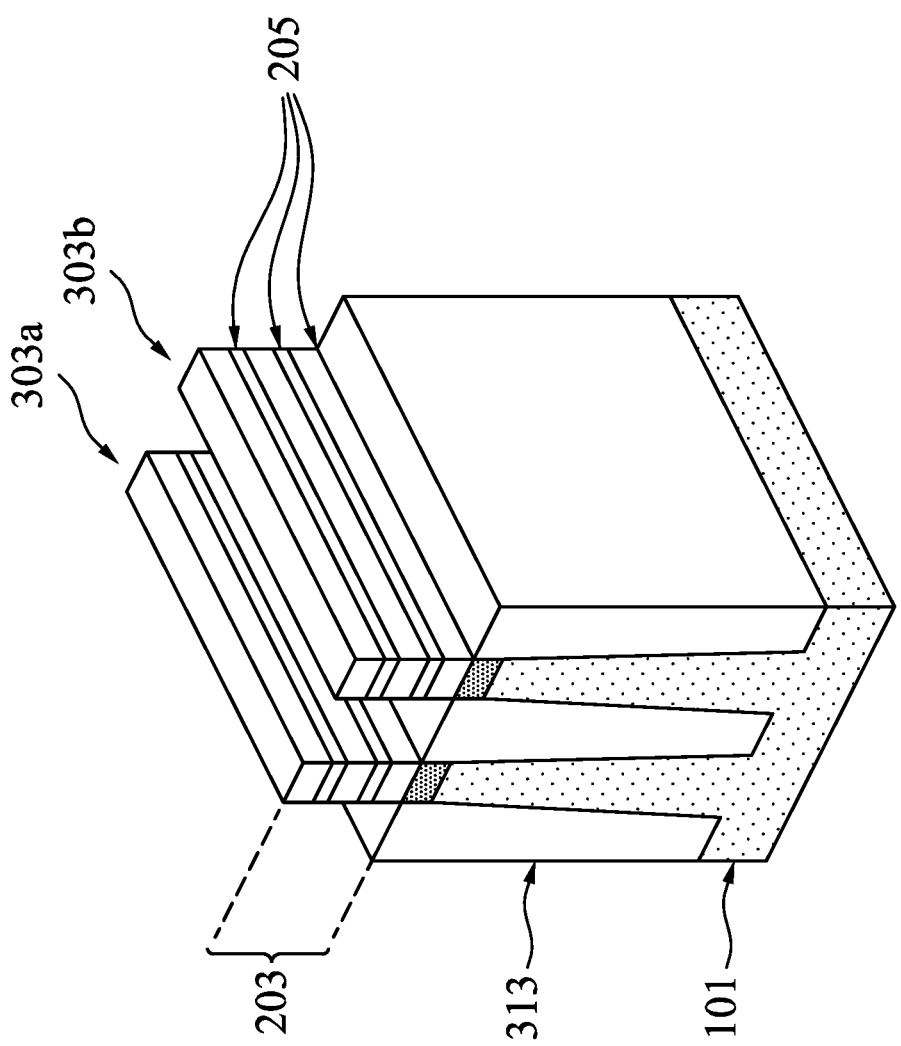

In FIG. 3C, the sidewalls of the fins 303 are exposed by recessing of the STIs 313. In an embodiment, the STIs 313 are recessed using one or more selective etch processes utilizing the fins 303 as an etch mask. For example, the STIs 313 are recessed using one or more etching processes. A depth of the recess is determined by a height of the superlattice 203. In an embodiment, the recess extends to a depth such that the bottommost first layer 205 is exposed. Alternatively, a bottom-most first layer 205 (e.g., SiGe layer) may remain below the upper surface of the STIs 313 and is discussed in more detail below.

Figure 4A:
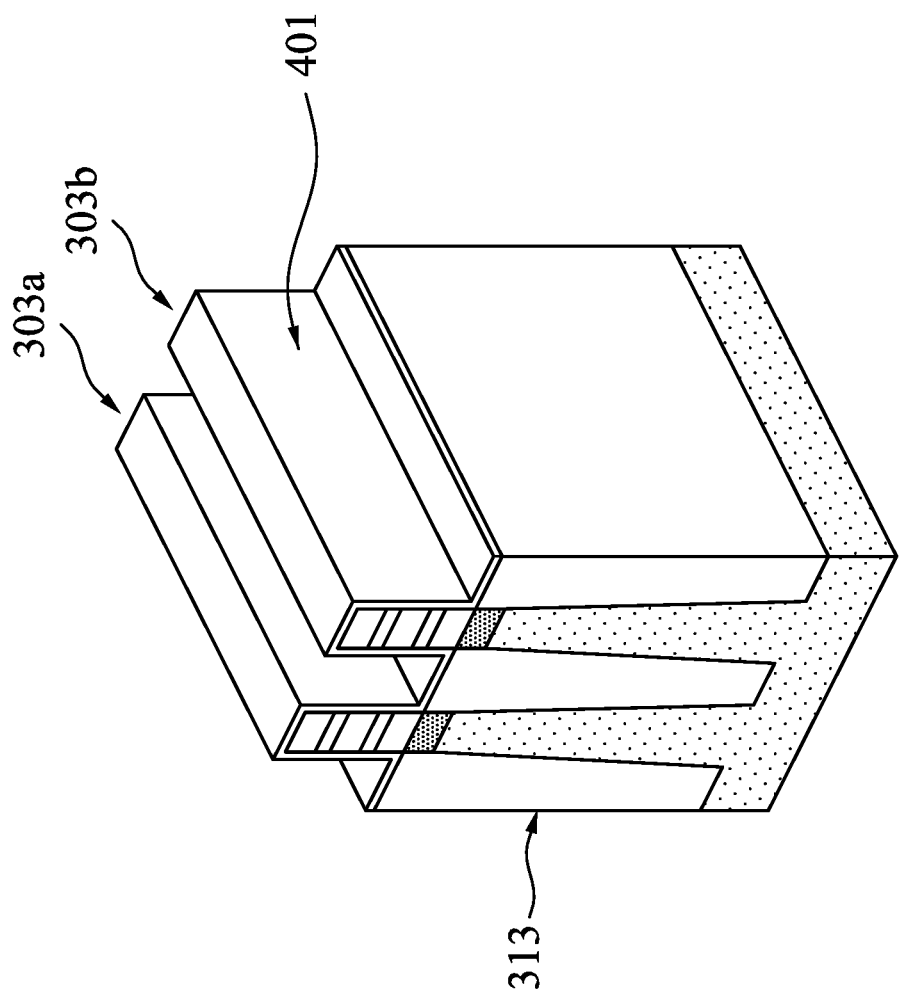
FIGS. 4A-4E illustrate various cross-sectional and perspective views of intermediate stages of forming a structure over portions of the patterned stack in accordance with some embodiments.

Referring to FIG. 4A, a dummy gate oxide layer 401 is formed over the exposed fins 303. In some embodiments, the dummy gate oxide layer 401 may be formed by thermal oxidation, CVD, sputtering, or any other methods known and used in the art for forming a dummy gate oxide layer 401. In some embodiments, the dummy gate oxide layer 401 may be formed of a same material as the STIs 313. In other embodiments, the dummy gate oxide layer 401 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. In other embodiments, the dummy gate oxide layer 401 includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

Figure 4B:
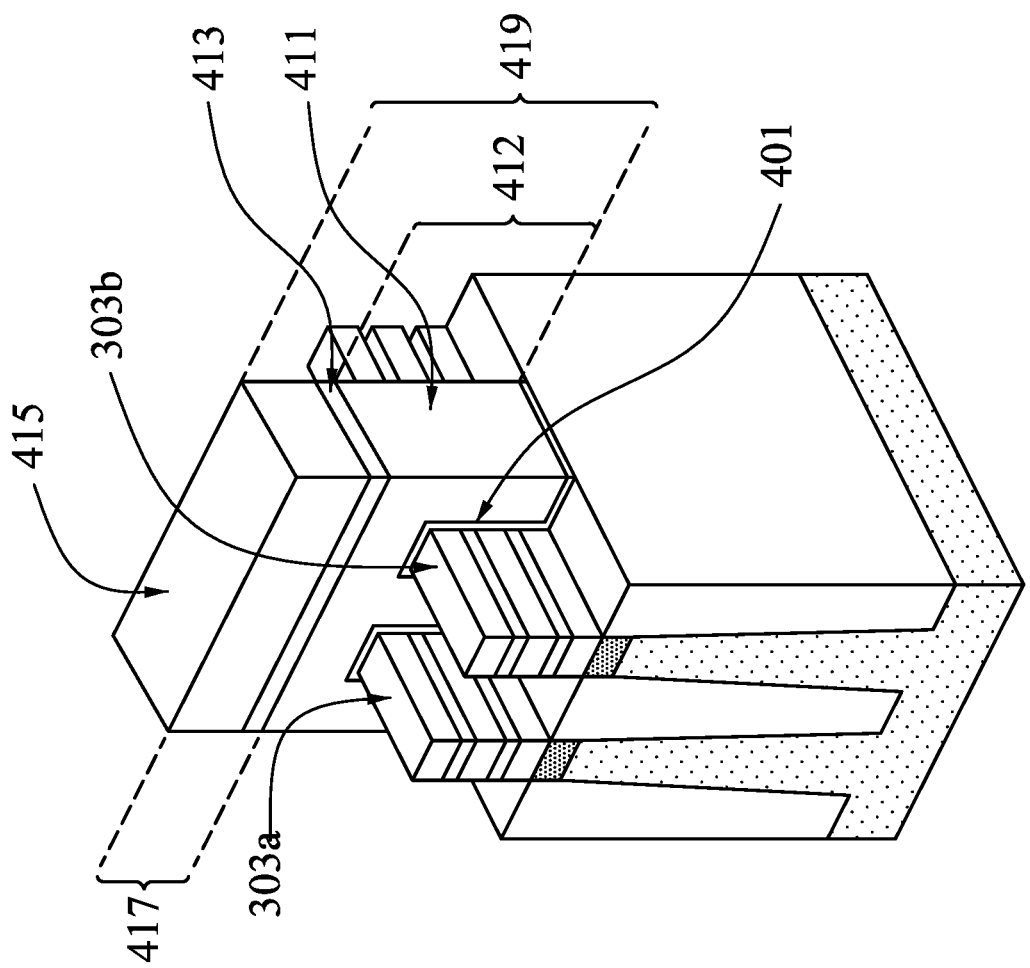

Moving to FIG. 4B, a dummy metal layer 411 is deposited over the dummy gate oxide layer 401 (shown in FIG. 4A). In an embodiment, the dummy metal layer 411 is a conductive material and may be selected from a group comprising polycrystalline-silicon (poly-Si), poly-crystalline silicon-germanium (poly-SiGe), metallic nitrides, metallic silicides, metallic oxides, and metals. In an embodiment, the dummy metal layer 411 may be deposited by PVD, CVD, sputter deposition, or other techniques known and used in the art for depositing conductive materials. Other materials, conductive and non-conductive, may be used. The top surface of the dummy metal layer 411 may be planarized after it is deposited.

A first hardmask layer 413 is deposited over the dummy metal layer 411 through a process such as CVD, or a spin-on-glass process, although any acceptable process may be utilized. In an embodiment, the first hardmask layer 413 may be an oxide layer (e.g., silicon oxide) and may have a thickness from about 10 Å to about 50 Å. A second hardmask layer 415 is then deposited on the first hardmask layer 413 through a process such as CVD, or a spin-on-glass process, although any acceptable process may be utilized. In an embodiment, the second hardmask layer 415 may be a nitride (e.g., silicon nitride). The second hardmask layer 415 may have a thickness from about 150 Å to about 850 Å. The first hardmask layer 413 and the second hardmask layer 415 are patterned to form a dummy gate hardmask layer stack 417 over the dummy metal layer 411. In an embodiment, a polysilicon etch and a dummy oxide removal process are performed using the dummy gate hardmask layer stack 417 to pattern the dummy metal layer 411 and the dummy gate oxide layer 401. During patterning, portions of the dummy metal layer 411 and portions of the dummy gate oxide layer 401 are removed from source/drain areas of fins 303 and portions of the dummy metal layer 411 and portions of the dummy gate oxide layer 401 remain over a channel region of fins 303 to form a dummy metal gate electrode 412, as shown in FIG. 4B. The dummy metal gate electrode 412 includes the patterned dummy metal layer 411 and the patterned dummy gate oxide layer 401 (shown in FIG. 4A) disposed below the patterned dummy metal layer 411. The dummy metal gate electrode 412 and the dummy gate hardmask layer stack 417 collectively form a dummy metal gate stack 419.

The dummy metal gate stack 419 will be used to define and form source/drain regions from the exposed portions of fins 303. The dummy metal gate stack 419 will then be removed to allow processing to be performed to define and form channel regions from the center portions of fins 303, as follows.

Figure 4C:
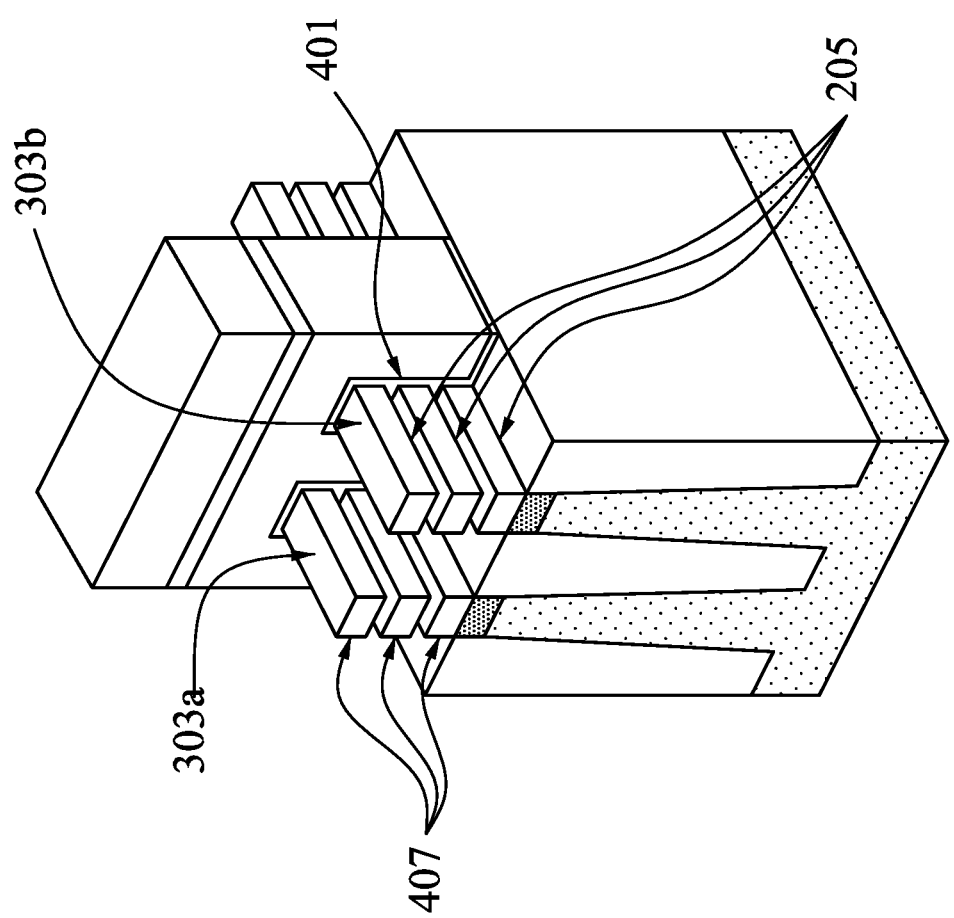

In FIG. 4C, in an embodiment to form an NFET device, a removal process for the first layers 205 (e.g., SiGe layers) is performed. After removal of the first layers 205 (indicated with dashed lines in FIG. 4C), the second layers 207 remain in the fins 303. In an embodiment, in which the first layers 205 are formed of silicon germanium (SiGe) and the second layers 207 are formed of silicon (Si), the first layers 205 may be removed, for example, by an NMOS SiGe removal process. In some embodiments, the removal process may use an etchant that etches the silicon germanium at a higher rate than the silicon, such as $NH_4OH:H_2O_2:H_2O$ (ammonia peroxide mixture, APM), $H_2SO_4+H_2O_2$ (sulfuric acid peroxide mixture, SPM), or the like. Other suitable processes and materials may be used. This etching process removes the first layers 205. Thus, first nanowires 407 are formed from fins 303 for an n-type device. In an embodiment, after etching, a bottom-most first layer 205 (e.g., SiGe layer) may remain below the upper surface of the STIs 313 as a stress layer within the fin 303a and 303b to provide certain strains or relaxations of the fin materials.

Additionally, while not specifically illustrated, to form a PFET device, a removal process for the second layers 207 (e.g., Si layers) in separate fins (not illustrated) is performed. After removal of the second layers 207 (e.g., Si layers), the first layers 205 (e.g., SiGe layers) remain in fins 303, in some embodiments. In an embodiment, the first layers 205 are formed of silicon germanium (SiGe) and the second layers 207 are formed of silicon (Si), the second layers 207 may be removed, for example, by a PMOS Si removal process. In some embodiments, the removal process may use a wet etch using a tetramethylammonium hydroxide (TMAH) solution, or the like. Other processes and materials may be used. This etching process removes the second layers 207. Thus, second nanowires 405 (not specifically shown) are formed from fins for a p-type device. In an embodiment, after performing the Si removal process, a bottom-most second layer 207 (e.g., Si layer) may remain below the upper surface of the STIs 313 within the fin 303a and 303b.

Furthermore, while not specifically illustrated, it is to be understood that an NFET device may be formed from any one of the fins 303 or a PFET device may be formed from any one of the fins 303. While not specifically illustrated, it is also to be understood, that an NFET device may be formed from one of the fins 303 and a PFET device may be formed from the other one of the fins 303. For example, an NFET device may be formed in the first fin 303a, according to an embodiment, by performing a first removal process (e.g., NMOS SiGe removal process described above) for the first layers 205 (e.g., SiGe layers) in the first fin 303a (with the second fin 303b masked) such that the second layers 207 (e.g., Si layers) remain in the first fin 303a. Thus, first nanowires 407 are formed in the first fin 303a for an n-type device. In addition, a second removal process (e.g., PMOS Si removal process described above) for the second layers 207 (e.g., Si layers) may be performed in the second fin 303b (with the first fin 303a masked) such that the first layers 205 (e.g., SiGe layers) remain in the second fin 303b. Thus, second nanowires 405 are formed in the second fin 303b for a p-type device.

Figure 4D:
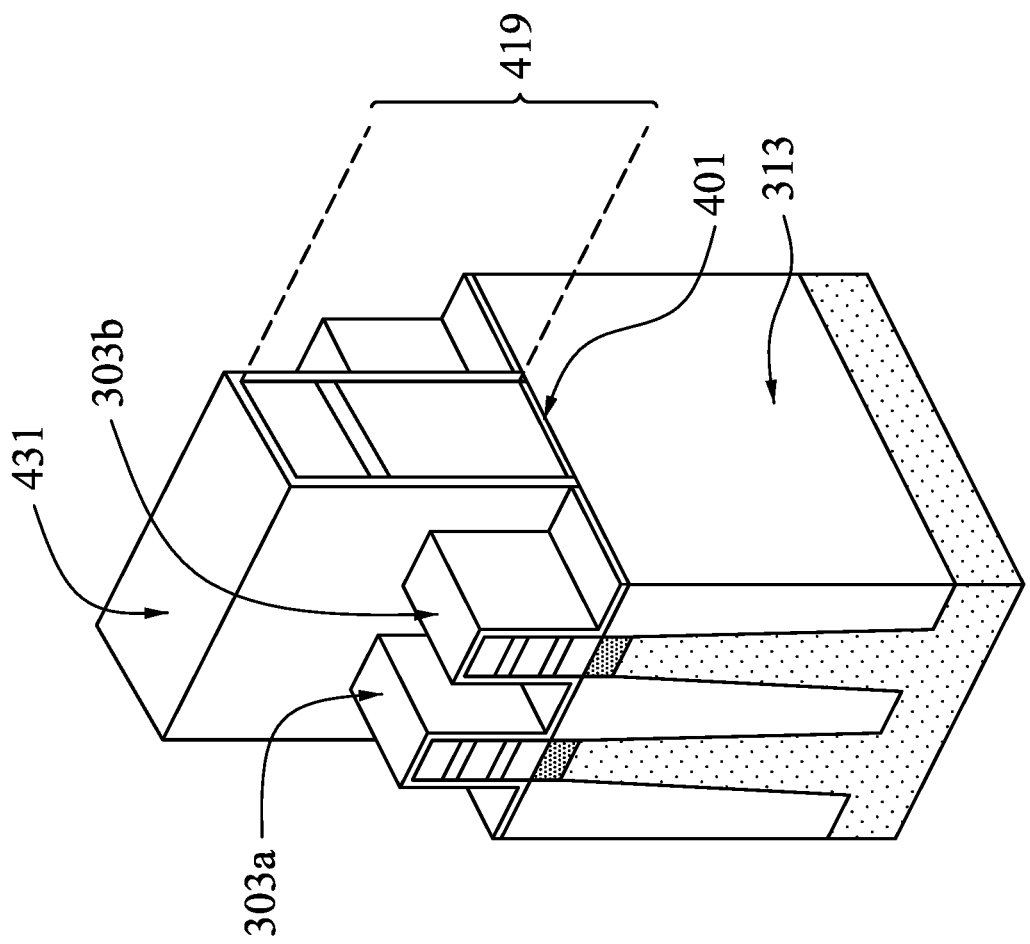

Referring now to FIG. 4D, a spacer layer 431 is deposited over the dummy metal gate stack 419, the fins 303, and the upper surface of STIs 313. In an embodiment, spacer layer 431 is formed of silicon nitride (SiN), and may have a single-layer structure. In other embodiments, the spacer layer 431 may have a composite structure including a plurality of layers. For example, a silicon nitride layer may be formed over the silicon oxide layer. In an embodiment, the spacer layer 431 may be conformally formed on the epitaxial source/drain regions of fins 303, both sidewalls and upper surface of the dummy metal gate stack 419 and the upper surface of the STIs 313. In an embodiment, the spacer layer 431 may be formed using atomic layer deposition (ALD), chemical vapor deposition (CVD), or the like, or a combination thereof.

Figure 4E:
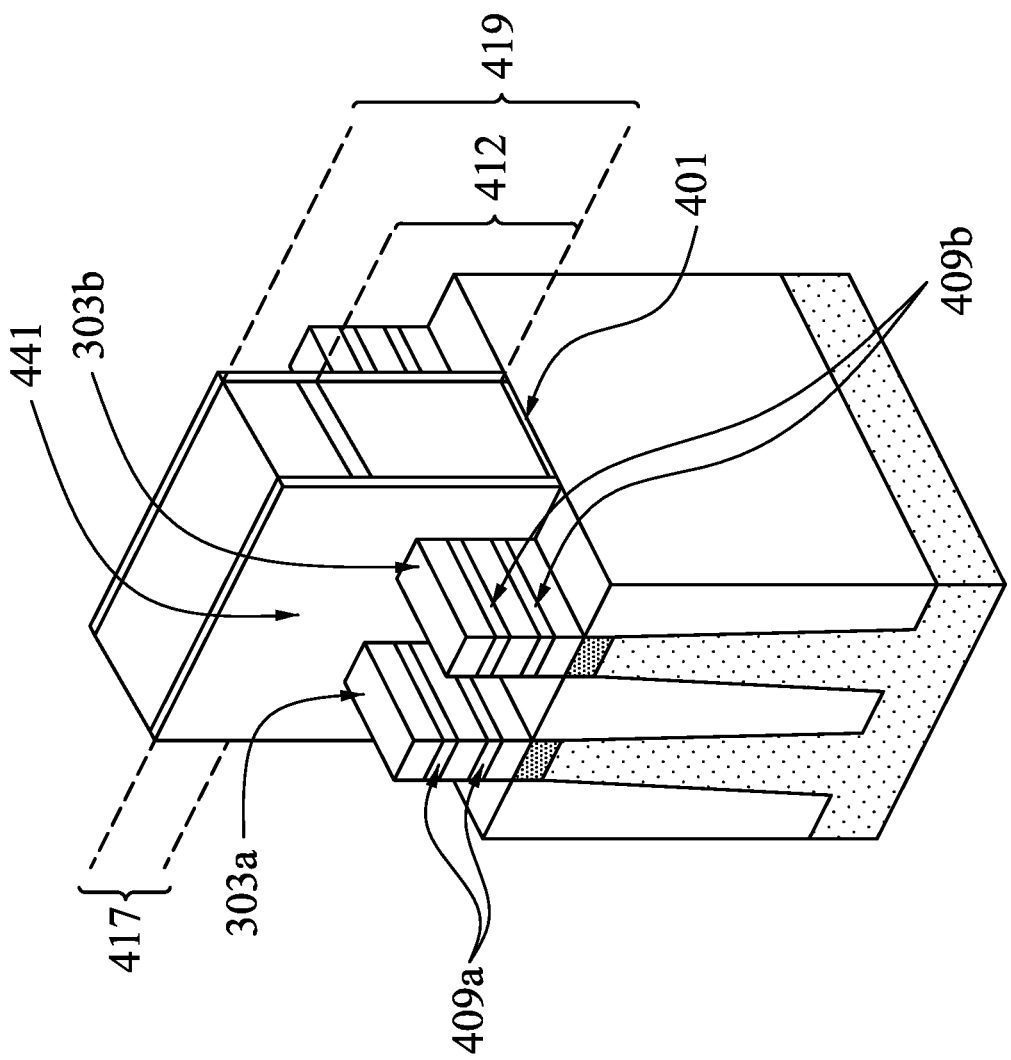

Referring now to FIG. 4E, the spacer layer 431 of FIG. 4D is patterned to form sidewall spacers 441 along sidewalls of the dummy metal gate stack 419 and first nanowire spacers 409a of the first fin 303a and second nanowire spacers 409b of the second fin 303b. The first nanowire spacers 409a and the second nanowire spacers 409b will be referred herein collectively as nanowire spacers 409. In an embodiment, an anisotropic etch process is utilized to remove the spacer layer 431 over horizontal portions of the device and along sidewalls of the dummy metal gate stack 419. Due to the difference in the thicknesses of the spacer layer 431 over horizontal portions of the device and along sidewalls of the fins 303, the spacer layer 431 remains along sidewalls of the dummy metal gate stack 419, forming sidewall spacers 441, while sidewalls and top surface of the fins 303 are exposed in the source/drain regions. In an embodiment, the remaining nanowire spacers 409 are formed to have a thickness of between about 6 nm and about 7 nm.

Figure 5A:
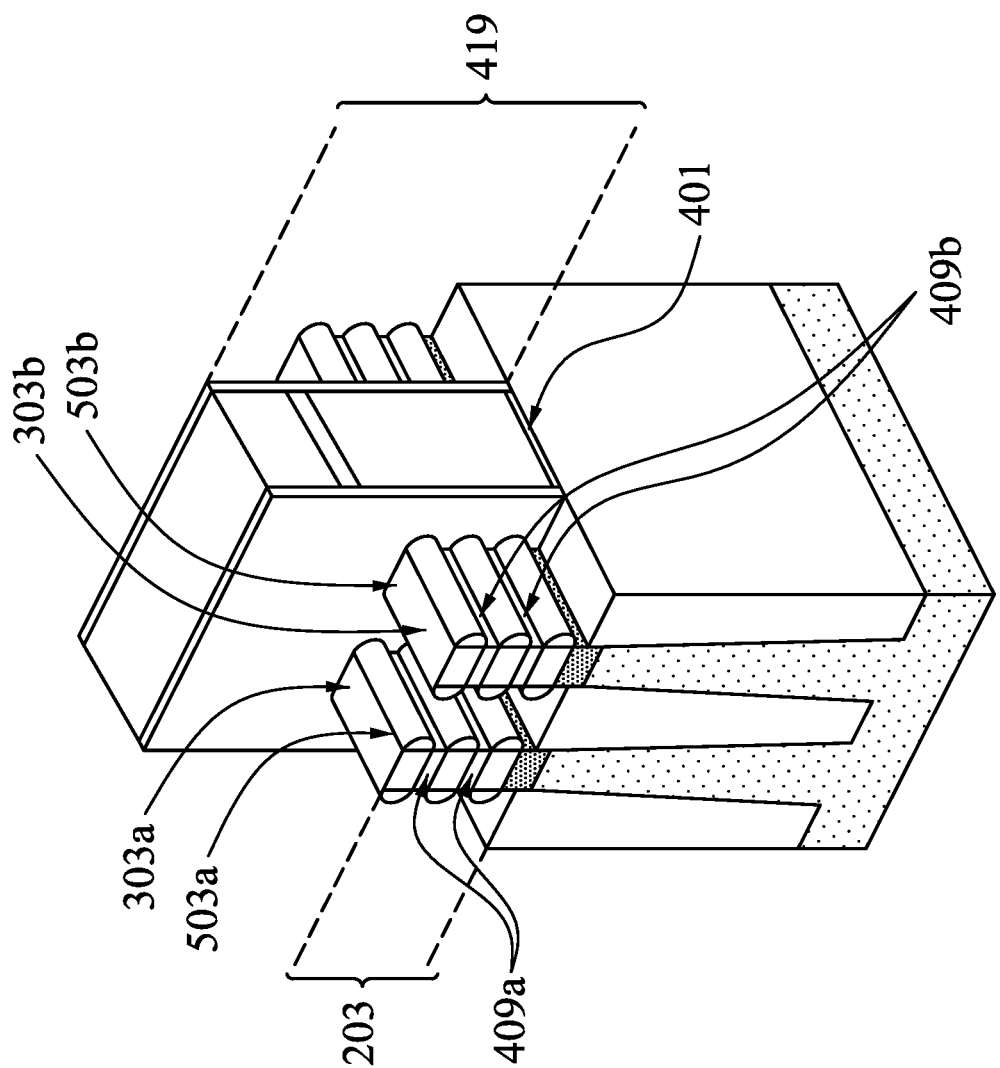
FIGS. 5A-5D illustrate various cross-sectional and perspective views of intermediate stages of preparing outer and central regions of the patterned stack and replacing the structure disposed over a central region of the patterned stack with a metal structure in accordance with some embodiments.

FIG. 5A illustrates a formation of epitaxial first source/drain regions 503a and epitaxial second source/drain regions 503b formed on exposed portions of the first fin 303a and the second fin 303b, respectively, along opposing sides of the dummy metal gate stack 419 in accordance with some embodiments. The use of epitaxially grown materials in the source/drain regions allows for the source/drain regions to exert stress in the channel regions. The materials used for the epitaxial first source/drain regions may be varied for the n-type and p-type FinFETs, such that one type of material is used for the n-type FinFETs to exert a tensile stress in the channel region and another type of material for the p-type FinFETs to exert a compressive stress. For example, SiP or SiC may be used to form n-type FinFETs, and SiGe or Ge may be used to form p-type FinFETs. However, any suitable material may be used.

While not specifically shown, in embodiments in which different materials are utilized for the n-type devices and the p-type devices, it may be desirable to mask one (e.g., the n-type fins) while forming the epitaxial material on the other (e.g., the p-type fins), and repeating the process for the other. The epitaxial first source/drain regions of first nanowires 407 may be doped either through an implanting process to implant appropriate dopants, or by in-situ doping as the material is grown. In some embodiments, the epitaxial first source/drain regions are formed of SiC or SiP doped with phosphorus (P) to form an n-type FinFET device and the epitaxial second source/drain regions are formed of SiGe or Ge doped with boron (B) to form a p-type FinFET device.

Figure 5B:
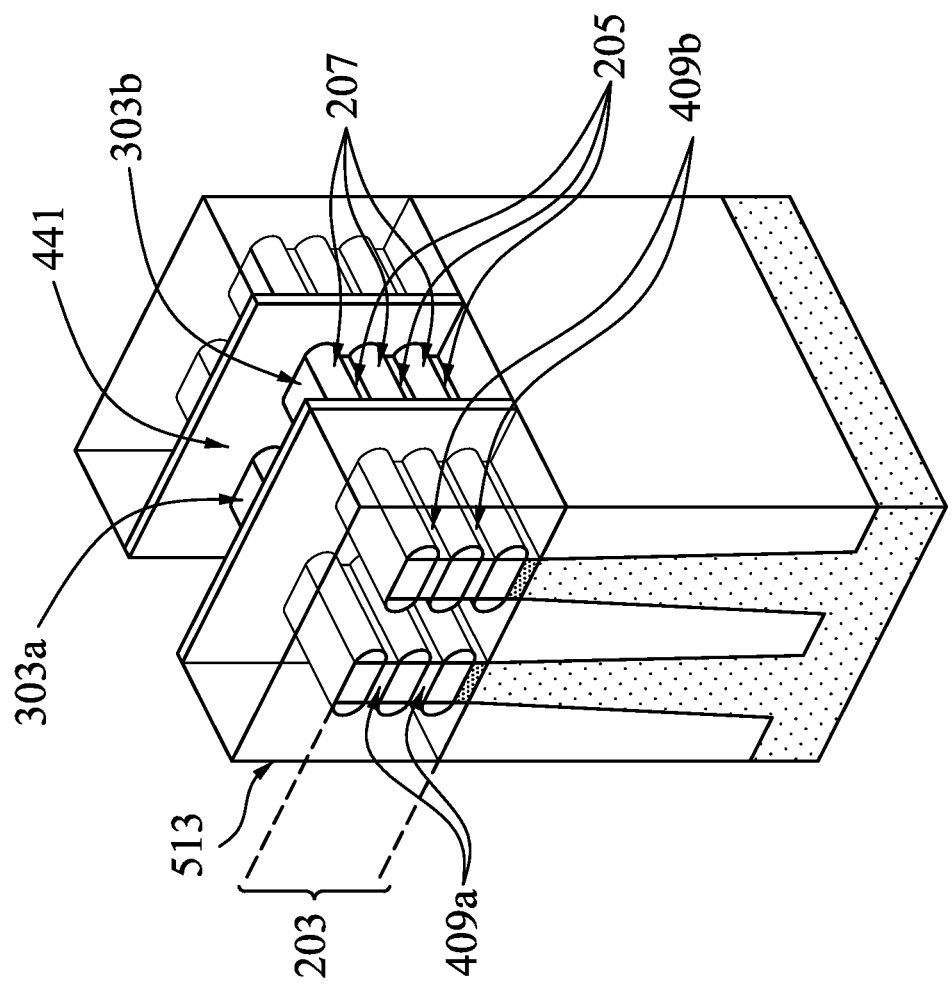

In FIG. 5B, a first inter-layer dielectric (ILD) 513 is formed over the epitaxial source/drain regions 503 on both sides of dummy metal gate stack 419. In some embodiments, the first ILD 513 may comprise silicon oxide, silicon nitride, the like, or a combination thereof. The first ILD 513 may be formed by CVD, a high density plasma (HDP), the like, or a combination thereof. Although not directly shown in FIG. 5B, the second ILD 515 is formed over epitaxial source/drain regions 503 on the opposite side of the dummy metal gate stack 419.

Subsequently, the first ILD 513 may be planarized to be substantially coplanar with top surfaces of the dummy metal gate stack 419 (shown in FIG. 5A), exposing the top surface of the dummy metal gate stack 419. In an embodiment, the first ILD 513 may be planarized by using, for example, a CMP to remove portions of the first ILD 513. In other embodiments, other planarization techniques may be used, such as etching.

Once the first ILD 513 is formed over the epitaxial source/drain regions 503 and the top surface of the dummy metal gate stack 419 is exposed, the dummy metal gate electrode 412 and the dummy gate hardmask layer stack 417 (shown in FIG. 5A) are removed in one or more etching step(s). The etching step(s) may be selective to the materials of the dummy metal gate electrode 412 and dummy gate oxide layer 401, which etching may be a dry or wet etching. During the etching of the dummy metal gate electrode 412, the dummy gate oxide layer 401 may be used as an etch stop layer. The dummy gate oxide layer 401 may then be etched after removal of the dummy metal gate electrode 412. An opening is formed between the source/drain regions 503 covered by the first ILD 513 and a channel region of the patterned fins 303 is exposed, as shown in FIG. 5B.

Figure 5C:
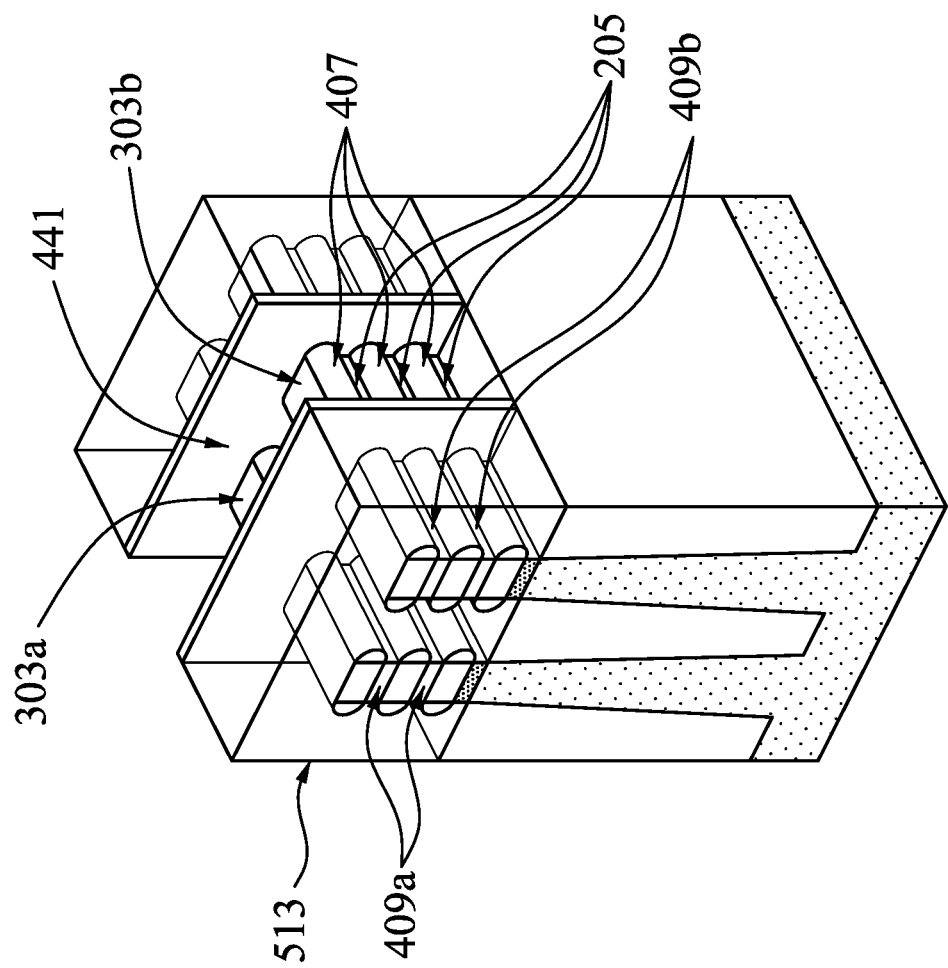

In FIG. 5C, the exposed channel region portions of the fins 303 are similarly processed according to the NMOS removal process performed on the respective source/drain regions of the fins 303, as described above with respect to FIG. 4C. In an embodiment to form an NFET device, a removal process for the first layers 205 (e.g., SiGe layers) is performed in the channel region portions of the fins 303. After removal of the first layers 205 (e.g., SiGe layers) (indicated with dashed lines in FIG. 5C), portions of the first diffusion interfaces 283, portions of the second diffusion interfaces 285 and the second layers 207 (e.g., Si layers) remain in fins 303 and are referred to herein as first nanowires 407. Each of the first nanowires 407 includes a core structure and a sheath layer formed from the remaining materials of the second layers 207, first diffusion interface 283 and the second diffusion interface 285. The core structure and sheath layer of first nanowires 407 are not specifically illustrated in FIG. 5C but will be discussed in greater detail later.

In an embodiment in which the first layers 205 are formed of silicon germanium (SiGe) and the second layers 207 are formed of silicon (Si), the first layers 205 may be removed, for example, by an NMOS SiGe removal process. In some embodiments, the removal process may use an etchant that etches the silicon germanium at a higher rate than the silicon, such as NH$_4$OH:H$_2$O$_2$:H$_2$O (ammonia peroxide mixture, APM), H$_2$SO$_4$+H$_2$O$_2$ (sulfuric acid peroxide mixture, SPM), or the like. Other suitable processes and materials may be used. This etching process removes the first layers 205 (e.g., SiGe layers). Thus, first nanowires 407 are formed from fins 303 for an n-type device.

Additionally, while not specifically illustrated, to form an PFET device, the exposed channel region portions of separate fins (not illustrated) are processed according to the PMOS removal process performed on the respective source/drain regions of the fins 303, as described above with respect to FIG. 4C. In an embodiment to form a PFET device, a removal process for the second layers 207 (e.g., Si layers) is performed in the channel region portions of the fins 303. According to an embodiment, after removal of the second layers 207 (e.g., Si layers), portions of the first diffusion interfaces 283, portions of the second diffusion interfaces 285, and the first layers 205 (e.g., SiGe layers) remain in fins 303 and are referred to herein as second nanowires 405 (not specifically illustrated). Each of the second nanowires 405 includes a core structure and a sheath layer formed from the remaining materials of the first layers 205 (e.g., SiGe layers), first diffusion interface 283 and the second diffusion interface 285.

In an embodiment in which the first layers 205 (e.g., SiGe layers) are formed of silicon germanium (SiGe) and the second layers 207 (e.g., Si layers) are formed of silicon (Si), the second layers 207 (e.g., Si layers) may be removed, for example, by an PMOS Si removal process. In some embodiments, the removal process may use a wet etch using a tetramethylammonium hydroxide (TMAH) solution, or the like. Other processes and materials may be used. This etching process removes the second layers 207. Thus, second nanowires 405 (not specifically shown) are formed from fins 303 for a p-type device.

Furthermore, while not specifically illustrated, it is to be understood that an NFET device may be formed in the channel region from any one of the fins 303 or a PFET device may be formed in the channel region from any one of the fins 303. While not specifically illustrated, it is also to be understood that an NFET device may be formed in a channel region from one of the fins 303 and a PFET device may be formed in a channel region from the other one of the fins 303. Following from the example above of forming an NFET device in the source/drain regions of the first fin 303a (as shown in FIG. 4C), the NFET device is likewise formed with the channel region for the first fin 303a. For example, an NFET device may be formed with the channel region of the first fin 303a, according to an embodiment, by performing a first removal process (e.g., NMOS SiGe removal process described above) for the first layers 205 (e.g., SiGe layers). The first removal process may be performed in the channel region of the first fin 303a such that the second layers 207 (e.g., Si layers) remain in the first fin 303a. Thus, first nanowires 407 are formed in the first fin 303a for an n-type device. In addition, following from the example above of forming a PFET device with the source/drain regions of the second fin 303b (as shown in FIG. 4C), the PFET device is likewise formed with the channel region of the second fin 303b, according to an embodiment, by performing a second removal process (e.g., PMOS Si removal process described above) for the second layers 207 (e.g., Si layers). The second removal process may be performed in the channel region of the second fin 303b such that the first layers 205 (e.g., SiGe layers) remain in the second fin 303b. Thus, second nanowires 405 are formed in the second fin 303b for a p-type device.

Figure 5D:
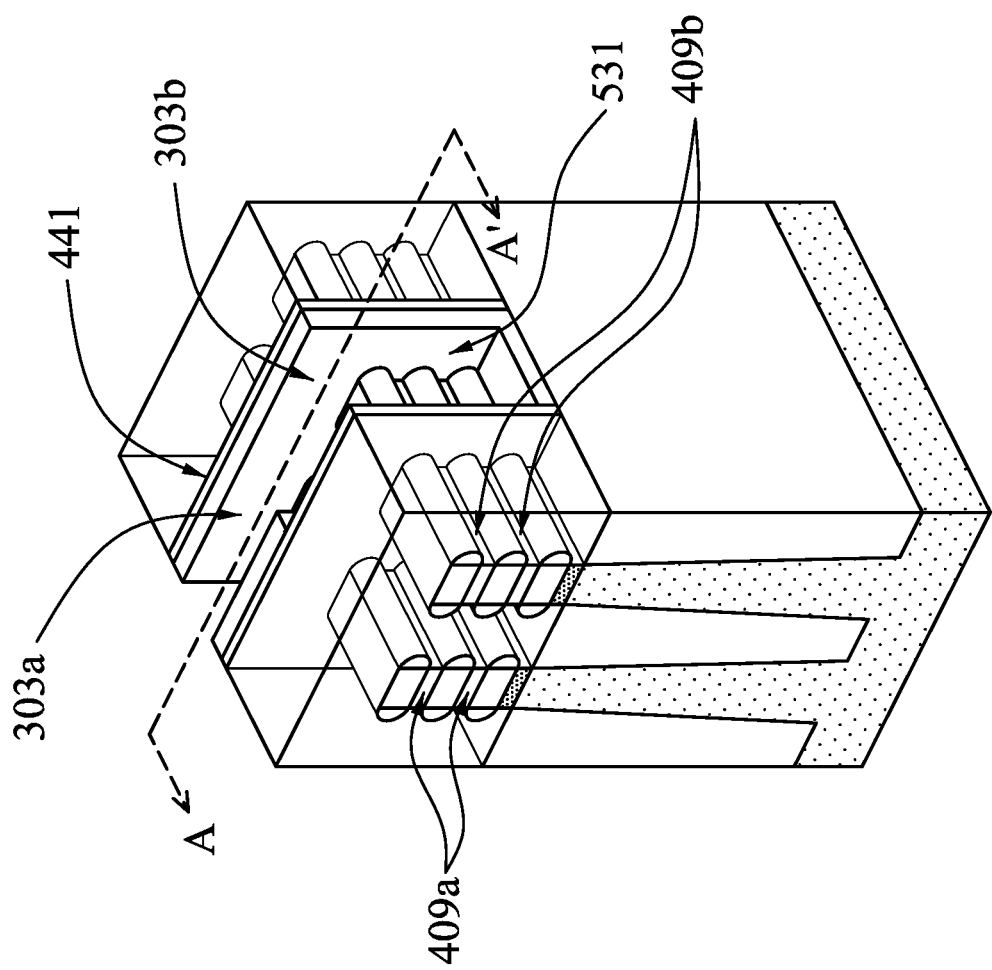

In FIG. 5D, a metal gate electrode 531 is formed over the exposed channel region portions of fins 303 and sidewall spacers 441 in the space vacated by the removal of the dummy metal gate stack 419. The metal gate electrode 531 may include a gate dielectric and a metal gate structure. The gate dielectric may be an interfacial dielectric (ILD) and is formed over the exposed portions of the source and drain regions of the first nanowires 407 (shown in FIG. 5C). The interfacial dielectric may be, for example, an oxide or the like formed by thermal oxidation, ALD, CVD, or the like. The gate dielectric can further include a high-k dielectric layer formed conformally on the top surface of the ILD and along sidewall spacers 441 and on the interfacial dielectric. The high-k dielectric layer may have a k value greater than about 7.0, and may include a metal oxide or a silicate of Hf, Al, Zr, La, Mg, Ba, Ti, Pb, and combinations thereof. The formation methods of high-k dielectric layer may include ALD, CVD, Molecular-Beam Deposition (MBD), the like, or a combination thereof. Other embodiments contemplate other materials for the gate dielectric, such as materials that are not high-k.

The metal gate structure is formed on the gate dielectric to form metal gate electrode 531. The metal gate structure can be a multi-layered structure. For example, the metal gate structure can include a capping layer conformally formed on the gate dielectric, one or more work function tuning layers conformally formed on the capping layer, and a metal-containing material, such as a metal, formed on the work function tuning layers and filling the space vacated by the removal of the dummy metal gate stack 419. In an example, the capping layer can comprise a first sub-layer on the gate dielectric formed of TiN or the like using ALD, CVD, or the like, and a second sub-layer on the first sub-layer formed of TaN or the like using ALD, CVD, or the like. The work function tuning layer(s) can be formed of TiAl, TiN, or the like using ALD, CVD, or the like. The metal-containing material can be tungsten (W), aluminum (Al), cobalt (Co), ruthenium (Ru), a combination thereof or the like deposited using CVD, physical vapor deposition (PVD), the like, or a combination thereof.

Next, a planarization process, such as a CMP, may be performed to remove the excess portions of metal gate structure and the gate dielectric, which excess portions are over the top surface of ILD, resulting in the structure shown in FIG. 5D.

The forgoing discussion describes a process for forming an n-type GAA transistor from the multi-layer structure 200 shown in FIG. 2A. In an embodiment, the multi-layered structure 200 is formed at a low temperature. For example, the multi-layered structure 200 is formed at a temperature less than about 600° C., such as between about 300-500° C., inclusive. Forming the multi-layer structure in these temperature ranges allows for the formation of the first diffusion interfaces 283 and the second diffusion interfaces 285 between the first layer 205 and the second layer 207 (e.g., Si layer) of the multi-layered structure 200 to be highly controlled. For example, the highly controlled formation of the interfaces allows for improved etching selectivity of the multi-layered structure 200. With the improved etching selectivity, nanowires of a horizontal GAA transistor may be formed from the multi-layer structure 200, such that the NWs have substantially same diameters. These benefits and other advantages will be discussed in greater detail and will become apparent in the following description of embodiments for forming the multi-layer structure 200 and embodiments for forming GAA transistors from the multi-layer structure 200 and with respect to the remaining Figures.

FIG. 6 illustrates, according to some embodiments, a cross-sectional view of a channel region of an n-type device (e.g., GAA NFET 609 of FIG. 6) and a cross-sectional view of a channel region of a p-type device (e.g., GAA PFET, previously described but not specifically shown in the other figures). These devices, shown in FIG. 6, have been formed from one or more multi-layer structures 200 with improved etching selectivity (shown in FIG. 2A) according to one or more embodiments described above. The improved etching selectivity and embodiments for forming the device allow for nanowires of the device to be formed with substantially equal diameters.

FIG. 6 illustrates a cross-sectional view taken through the center of the metal gate structure 531 (i.e., dashed line A to A', as shown in FIG. 5D) of a channel region of gate all around (GAA) transistor device. The GAA transistor device illustrated in FIG. 6 includes an embodiment of an n-type device (e.g., NFET 609) and a p-type device (e.g., PFET 603), formed as gate all around (GAA) transistors. Only a portion of the metal gate structure 531 surrounding the stack of nanowires 607 and the stack of nanowires 605 is illustrated in FIG. 6 and the sidewall spacer 441 is not illustrated in FIG. 6 for clarity purposes. The NFET 609 includes a stack of horizontal Si nanowire 607 with the metal gate electrode 531 conformally formed in the channel region of the GAA transistor, according to some embodiments described herein.

In an embodiment to form the stack of horizontal Si nanowire 607 and continuing from FIG. 5C above, after removal of the first layers 205 (as indicated with dashed lines in FIG. 5C), each of the first nanowires 407 includes a Si nanowire core structure $407_{Core}$ formed from the semiconductor material of the second layer 207 (e.g., Si layer) having a first diameter $D_{207}$. In an embodiment, the first diameter $D_{207}$ is about 3 nm to about 20 nm, or about 8 nm.

In an embodiment, after removal of the first layers 205, a first portion 683 of a sheath layer 680 of the first diffusion interface 283 is located on one side of the Si nanowire core structure $407_{Core}$ that faces toward the substrate mom. In an embodiment, the first portion 683 of the sheath layer 680 has a thickness (e.g., Si/SiGe abruptness) of less than about 2 nm, such as less than about 1 nm, or less than about 0.96 nm. The first portion 683 of the sheath layer 680 has the same feature characteristics of the first diffusion interface 283. For example, the first portion 683 of the sheath layer 680 has the same graded semiconductor material (e.g., Ge % SiGe) of the first diffusion interface 283. In an embodiment, the first portion 683 of the sheath layer 680 has a graded percentage concentration of germanium from 50% to 0%. The one side of the first portion 683 of the sheath layer 680 with the higher gradient percentage concentration (e.g., 50% SiGe) faces away from the Si nanowire core structure $407_{Core}$ (e.g., Si core) and the opposing side of the first portion 683 of a sheath layer 680 with the lower gradient percentage concentration (e.g., 0% SiGe) faces toward the Si nanowire core structure $407_{Core}$ (e.g., Si core).

In addition, when removing the first layers 205 (e.g., SiGe layers), a second portion 685 of the sheath layer 680 is formed from the remaining materials of the second diffusion interface 285 on an opposing side of the Si nanowire core structure $407_{Core}$ that faces away from the substrate mom. In an embodiment, the second portion 685 of the sheath layer 680 has a thickness (e.g., Si/SiGe abruptness) of less than about 2 nm, such as less than about 1 nm, or less than about 0.96 nm. The second portion 685 of the sheath layer 680 has the same feature characteristics of the second diffusion interface 285. For example, the second portion of the sheath layer 685 has the same graded semiconductor material (e.g., Ge % SiGe) of the second diffusion interface 285. For example, the second portion 685 of the sheath layer 680 has a graded percentage concentration of germanium from about 0% to about 60%, such as 50%, to 0% SiGe that extends from one side to an opposing side of the second portion 685 of the sheath layer 680. In an embodiment, the second portion 685 of the sheath layer 680 has a graded percentage concentration of germanium from 50% to 0%. The one side of the second portion 685 of the sheath layer 680 with the higher gradient percentage concentration (e.g., 50% SiGe) faces away from the NW core (e.g., Si core) and the opposing side of the second portion 685 of the sheath layer 680 with the lower gradient percentage concentration (e.g., 0% SiGe) faces toward the NW core $407_{Core}$ (e.g., Si core). Other materials, gradient percentage concentration levels, and feature thickness of the sheath layer 680 and NW core structure $407_{Core}$, may be also be realized based on one or more embodiments utilized to form the multi-layered structure 200.

According to an embodiment, the sheath layer 680 of the NMOS device 609 may have a material composition that transitions radially outward from the NW core $407_{Core}$ (e.g., Si core), through the sheath layer 680 (e.g., $Si_xGe_{1-x}$), to a residual cap layer formed from the first layer 205 (e.g., $Si_{0.5}Ge_{0.5}$). According to this embodiment, Si represents the composition ratio of the NW core $407_{Core}$ being 100% silicon, $Si_xGe_{1-x}$ represents the composition ratio of the sheath layer 680 being 100x % silicon and 100(1−x) % germanium, with x going from 1 to 0.5 as the sheath layer 680 extends from the NW core $407_{Core}$ to the residual cap layer formed from the first layer 205, and $Si_{0.5}Ge_{0.5}$ represents a material composition ratio of the residual cap layer formed from the first layer 205 being 50% silicon and 50% germanium.

The metal gate electrode 531 is conformally formed in the channel region of the GAA transistor and surrounds the stack, according to some embodiments described herein. In an embodiment, the horizontal GAA first nanowires 407 are formed to have a diameter $D_{207}$ of between about 3 nm and about 20 nm, such as about 8 nm. In an embodiment, the diameter of the Si NWs may be less than 8-9 nm. In an embodiment, an NMOS FET is formed with 3 or more horizontal first nanowires 407 with source and drain S/D areas having phosphorous or arsenic doping.

FIG. 6 further illustrates in a cross-sectional view a channel region of an embodiment of a p-type device (e.g., PFET 603) formed as a gate all around (GAA) transistor. The PFET 603 is not specifically shown in the other figures; however, the p-type devices are described above with respect to the previous figures of a GAA transistor. The PFET 603 includes a stack of horizontal NWs 605 (e.g., second nanowires 405) with the metal gate electrode 531 conformally formed around the channel region of the GAA transistor, according to some embodiments described herein.

In an embodiment, to form the stack of horizontal nanowires 605 and continuing from above with reference to FIG. 5C, after removal of the second layers 207 (e.g., Si layers) (not specifically shown), each of the second nanowires 405 includes a SiGe nanowire core structure $405_{Core}$ formed from the remaining materials of one of the first layers 205 (e.g., SiGe layers) and has a second diameter $D_{205}$. In an embodiment, the SiGe nanowire core structure $405_{Core}$ (e.g., SiGe) has a second diameter $D_{205}$. In an embodiment, the second diameter $D_{205}$ is about 3 nm to about 20 nm, or about 8 nm.

After removal of the second layers 207 (e.g., Si layers), a first section 695 of a sheath layer 690 is formed from the remaining materials of the second diffusion interface 285 on one side of the SiGe nanowire core structure $405_{Core}$ that faces toward the substrate 101. In an embodiment, the first portion 695 of the sheath layer 690 has a thickness (e.g., Si/SiGe abruptness) of less than about 2 nm, such as less than about 1 nm, or less than about 0.96 nm. The first portion 695 of the sheath layer 690 has the same feature characteristics of the second diffusion interface 285.

In addition, when removing the second layers 207 (e.g., Si layers), a second portion 693 of the sheath layer 690 is formed from the remaining materials of the first diffusion interface 283 on an opposing side of the SiGe nanowire core structure $405_{Core}$ that faces away from the substrate 101. In an embodiment, the second portion 693 of the sheath layer 690 has a thickness (e.g., Si/SiGe abruptness) of less than about 2 nm, such as less than about 1 nm, or less than about 0.96 nm. The second portion 693 of the sheath layer 690 has the same feature characteristics of the first diffusion interface 283. Other materials, gradient percentage concentration levels, and feature thickness of the sheath layer 690 and SiGe nanowire core structure $405_{Core}$, may also be realized based on one or more embodiments utilized to form the multi-layered structure 200.

According to an embodiment, the sheath layer 690 of the PMOS device 603 may have a material composition that transitions radially outward from the NW core $405_{Core}$ (e.g., SiGe core), through the sheath layer 690 (e.g., $Si_xGe_{1-x}$), to a residual cap layer formed from the second layer 207 (e.g., Si). According to this embodiment, $Si_{0.5}Ge_{0.5}$ represents a material composition ratio of the NW core $405_{Core}$ being 50% silicon and 50% germanium, $Si_xGe_{1-x}$ represents the composition ratio of the sheath layer 690 being 100x % silicon and 100(1−x) % germanium, with x going from 0.5 to 1 as the sheath layer 690 extends radially outward from the NW core $405_{Core}$ the residual cap layer formed from the second layer 207, and Si represents the composition ratio of the residual cap layer formed from the second layer 207 being 100% silicon.

Although only two devices are shown in FIG. 6, it is to be understood that any number of n-type devices and any number of p-type devices may be formed from the multi-layer structure 200. For example, in an embodiment with reference to FIG. 5D, n-type devices (e.g., NFET 609) may be formed in fins 303 and in another embodiment, p-type devices (not specifically shown) may be formed from fins 303. It is also to be understood that any number of n-type devices and any number of p-type devices may be formed from a same multi-layer structure 200 using one or more process embodiments disclosed above. For example, in another embodiment with reference to FIG. 5D, an n-type device (e.g., NFET 609) may be formed in fin 303a and a p-type device (not specifically shown) may be formed from the second fin 303b. As discussed above, the NFET 609 of an n-type device, as shown in FIG. 5D, of a gate all around (GAA) transistor.

The forgoing discussion describes a process for forming an n-type device (e.g., NFET 609) of a gate all around (GAA) transistor and p-type device (e.g., PFET 603) of a gate all around (GAA) transistor. In an embodiment, the horizontal nanowires NWs of NFET 609 and horizontal nanowires NWs of PFET 603 are formed to have substantially same diameters. In an embodiment, an "all-in-one" Si cap is formed around the second nanowires 405 of PFET 603. Although not specifically shown in FIG. 6, the Si cap is discussed in greater detail below. These benefits and other advantages will be discussed in greater detail and will become apparent in the following description of embodiments of forming the transistor from the multi-layer structure 200 with respect to the remaining Figures.

Figure 7:
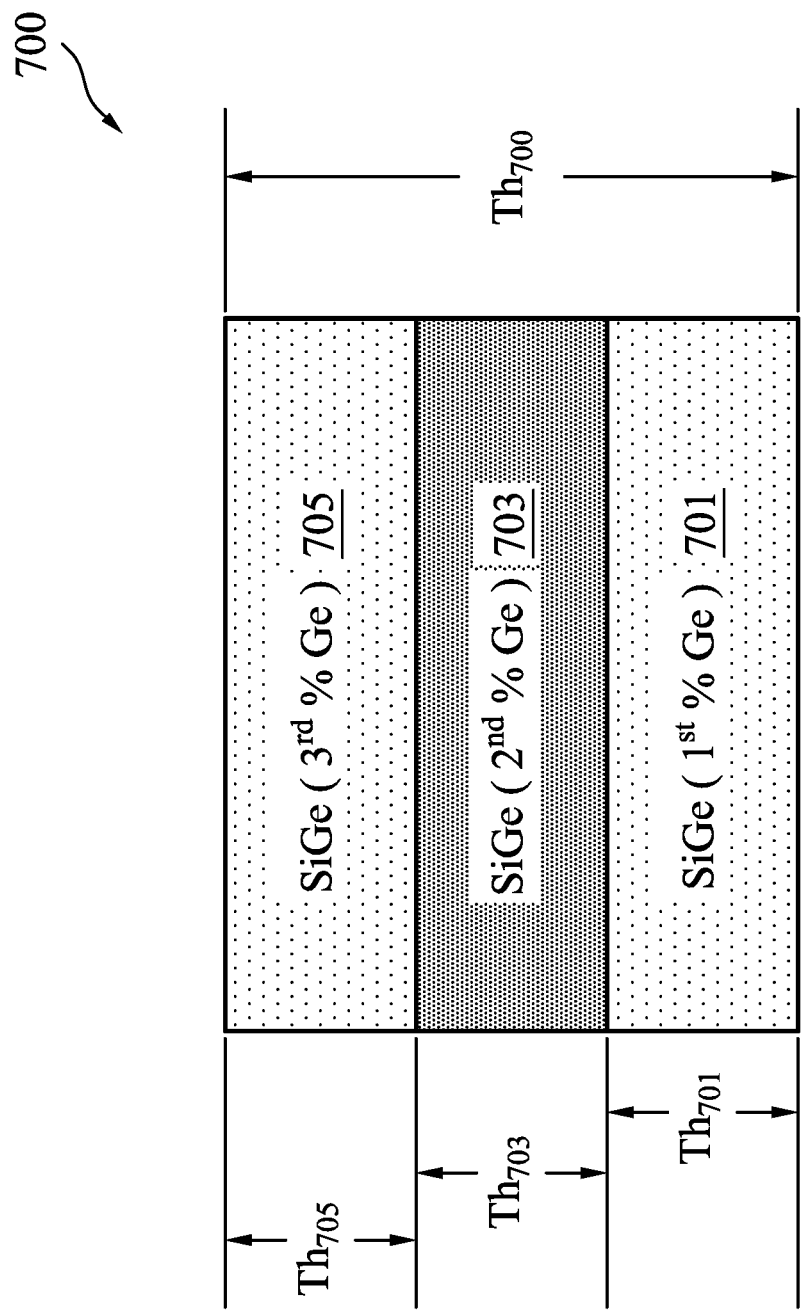
FIG. 7 illustrates a more detailed cross-sectional view of another embodiment of a first layer of the superlattice of FIG. 2D in accordance with some embodiments.

FIG. 7 illustrates another embodiment which may be used to reduce the thickness of the interface. In this embodiment, rather than utilizing a lowered temperature, a graded layer is formed.

In FIG. 7, the first layer 205 (e.g., SiGe layer) of the superlattice 203 (as shown in FIG. 2D) may be formed as a first graded layer 700 of two or more gradient layers of a same semiconductor material, each having a percentage concentration of an element of the semiconductor material. In an embodiment, as shown in FIG. 7, the first graded layer 700 may be formed as a graded layer of a first semiconductor material (e.g., SiGe) including, for example, a first gradient layer 701 with a first gradient percentage (e.g., $1^{st}$% Ge of SiGe), a second gradient layer 703 with a second gradient percentage (e.g., $2^{nd}$% Ge of SiGe), and a third gradient layer 705 with a third gradient percentage (e.g., $3^{rd}$% Ge of SiGe).

In an embodiment, the first gradient layer 701, the second gradient layer 703 and the third gradient layer 705 may be formed as portions of the first graded layer 700. For example, the second gradient layer 703 may be formed as an intermediate portion of the first graded layer 700 disposed between outer portions (e.g., the first gradient layer 701 and the third gradient layer 705) of the first graded layer 700. In an embodiment, the second gradient percentage (e.g., 2nd % Ge of SiGe) of the intermediate portion of the first graded layer 700 may be greater than the first gradient percentage (e.g., 1st % Ge of SiGe) and the third gradient percentage (e.g., 3rd % Ge of SiGe) of the outer portions (e.g., first gradient layer 701 and third gradient layer 705) of the first graded layer 700. For example, the intermediate portion of the first graded layer 700 (e.g., SiGe) may have a gradient percentage of about 50% Ge atomic % and the outer portions of the first graded layer 700 (e.g., SiGe) may have gradient percentages of about 15% Ge. However, it is to be understood that the first graded layer 700 may be formed to include any suitable number of gradient layers any suitable materials with any suitable number of gradient percentages.

Continuing with FIG. 7, in an embodiment, the formation of the first graded layer 700 may be initiated and controlled by the control unit 245 such that the showerhead 249 can disperse the first precursor material, the second precursor material, and the reactant material into the deposition chamber 237, as discussed above and shown in FIG. 2D, wherein the first precursor material, the second precursor material, and the reactant material can be adsorbed and react with each other to form the first gradient layer 701 of a first semiconductor material (e.g., SiGe) having a first percentage concentration of germanium (e.g., $1^{st}$% Ge). The first percentage concentration may be a percentage between about 5% and 30%, such as about 20%, or about 15%. In an embodiment, as illustrated in FIG. 7, to form the first gradient layer 701 to have a first % Ge (e.g., 15%), the first precursor material may be flowed into the deposition chamber 237 at a flow rate of between about 50 sccm and about 1000 sccm, such as about 600 sccm, the second precursor material may be flowed into the deposition chamber 237 at a flow rate of between about 10 sccm and about 1000 sccm, such as about 200 sccm, and the reactant material may be flowed into the deposition chamber at a flow rate of between about 50 sccm and about 600 sccm, such as about 100 sccm. Additionally, the deposition chamber 237 may be held at a pressure of between about 5 torr and about 600 torr, such as about 20 torr, and a temperature of between about 350° C. and about 600° C., such as about 400° C. In another embodiment the temperature may be between about 650° C. and about 680° C. However, as one of ordinary skill in the art will recognize, these process conditions are only intended to be illustrative, as any suitable process conditions may be utilized while remaining within the scope of the embodiments. In an embodiment, first gradient layer 701 is formed to have a thickness $Th_{701}$ of between about 1 nm and about 10 nm, such as about 3 nm. In some embodiment, using a multiple ranges of temperatures allows for maintaining better control of the diffusion interface.

To form the second gradient layer 703 to have the second % Ge (e.g., 50%), the first precursor material may be changed to flow into the deposition chamber 237 at a flow rate of between about 50 sccm and about 1000 sccm, such as about 700 sccm, the second precursor material may be changed to flow into the deposition chamber 237 at a flow rate of between about 50 sccm and about 1000 sccm, such as about 100 sccm, and the reactant material may be changed to flow into the deposition chamber at a flow rate of between about 10 sccm and about 500 sccm, such as about 80 sccm. Additionally, the deposition chamber 237 may be held at a pressure of between about 5 torr and about 600 torr, such as about 10 torr, and a temperature of between about 350° C. and about 620° C., such as about 600° C. or 380° C. However, as one of ordinary skill in the art will recognize, these process conditions are only intended to be illustrative, as any suitable process conditions may be utilized while remaining within the scope of the embodiments. In an embodiment, second gradient layer 703 is formed to have a thickness $Th_{703}$ of between about 4 nm and about 20 nm, such as about 6 nm.

In an embodiment, to form the third gradient layer 705 to have a third % Ge (e.g., 15%), the first precursor material may be changed to flow into the deposition chamber 237 at a flow rate of between about 50 sccm and about 1000 sccm, such as about 600 sccm, the second precursor material may be changed to flow into the deposition chamber 237 at a flow rate of between about 50 sccm and about 1000 sccm, such as about 200 sccm, and the reactant material may be changed to flow into the deposition chamber at a flow rate of between about 10 sccm and about 500 sccm, such as about 100 sccm. Additionally, the deposition chamber 237 may be held at a pressure of between about 5 torr and about 600 torr, such as about 10 torr, and a temperature of between about 350° C. and about 600° C., such as about 400° C. However, as one of ordinary skill in the art will recognize, these process conditions are only intended to be illustrative, as any suitable process conditions may be utilized while remaining within the scope of the embodiments. In an embodiment, the third gradient layer 705 is formed to have a thickness $Th_{705}$ of between about 1 nm and about 10 nm, such as about 3 nm.

By forming the first gradient layer 701, the second gradient layer 703 and the third gradient layer 705 as described, the concentration of, e.g., germanium adjacent to the second layer 207 (e.g., silicon) may be reduced. As such, because of this lower concentration, any subsequent diffusion of the germanium across the border will also be reduced, thereby helping to reduce the thickness of the interface between the layers.

Figure 8:
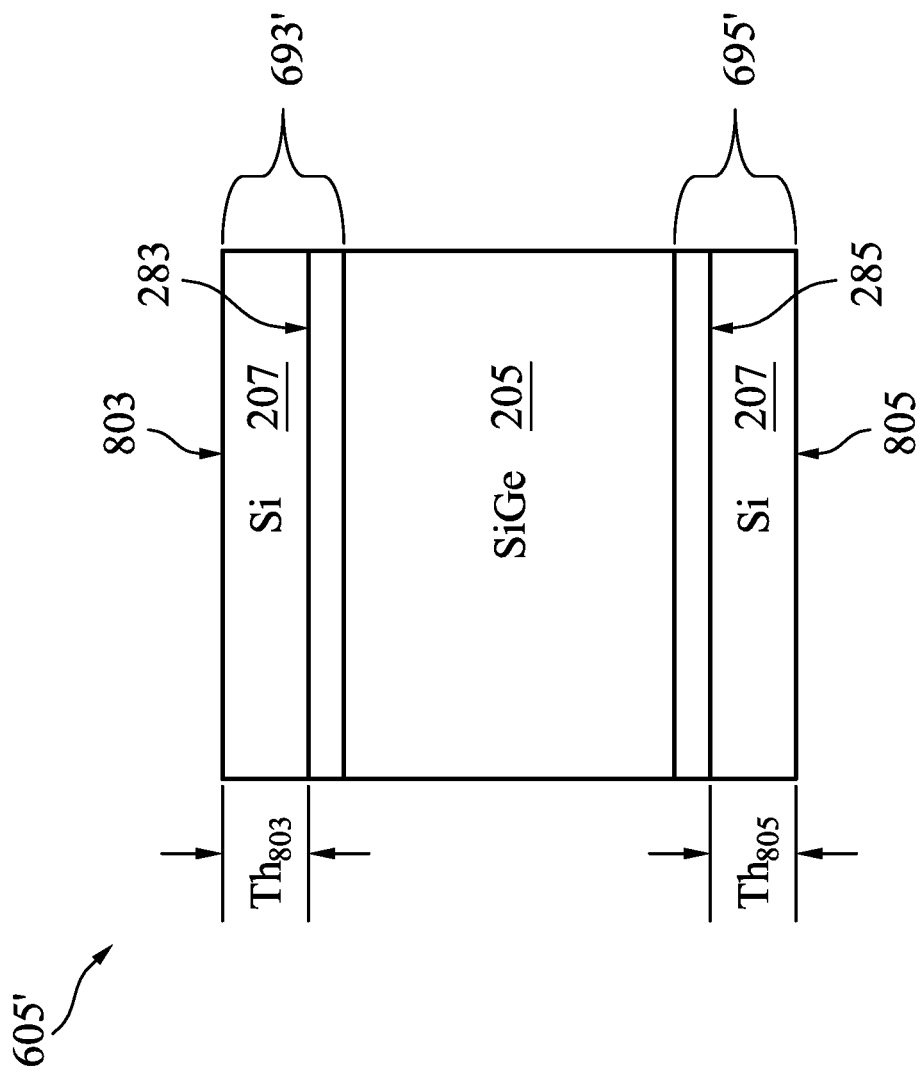
FIG. 8 illustrates more detailed cross-sectional views of the resulting SiGe NW formed, as discussed above with regard to FIGS. 2E and 4C, in some embodiments.

FIG. 8 illustrates another embodiment for forming SiGe nanowires 605' in a p-type device (e.g., NWs 605' of PFET 603 in FIG. 6) including a compound sheath layer (not specifically shown in FIG. 6) that allows for a more robust structure of the SiGe nanowires 605' during formation. FIG. 8 illustrates a more detailed view of the resulting SiGe nanowires 605' formed after the second layer 207 (e.g., Si layer) is substantially removed during the PMOS Si removal process, as discussed above with regard to FIGS. 2E, 2F, 4C and 5C, in some embodiments.

To form the stack of horizontal NWs 605' and continuing from above with reference to FIG. 5C, after removal of the second layers 207 (not specifically shown), each of the SiGe nanowires 605' includes a core structure $405_{Core}$ formed from the remaining materials of one of the first layers 205 (e.g., SiGe layers) and has a diameter $D_{205}$.

After removal of the second layers 207 (e.g., Si layers), a first section 695' of a compound sheath layer is formed from the remaining materials of the second diffusion interface 285 and a residual portion of the second layer 207 (e.g., Si layer), herein referred to as the first residual portion 805. The first section 695' of the compound sheath layer is formed as a compound stack of the semiconductor materials of the second diffusion interface 285 (e.g., graded layer of SiGe) and the semiconductor materials of the first residual portion 805 (e.g., Si). The first section 695' on one side of the SiGe nanowire core structure $405_{Core}$ faces toward the substrate 101.

The first residual portion 805 of the first section 695' of the compound sheath layer is the same material as the second layer 207 (e.g., Si layer) and has a thickness $Th_{805}$ of between 0.5 nm and 10 nm, or about 1 nm. In one embodiment, the first residual portion thickness $Th_{805}$ is 0.96 nm. The first residual portion 805 is spaced apart from the SiGe nanowire core structure $405_{Core}$ by the second diffusion interface 285 of the first section 695' of the compound sheath layer that is disposed on a side of the SiGe nanowire core structure $405_{Core}$ that faces toward the substrate 101.

In addition, after removal of the second layers 207 (e.g., Si layers), a second section 693' of a compound sheath layer is formed from the remaining materials of the first diffusion interface 283 and a residual portion of another second layer 207 (e.g., Si layer) and is herein referred to as the second residual portion 803. The second section 693' of the compound sheath layer is formed as a compound stack of the semiconductor materials of the first diffusion interface 283 (e.g., graded layer of SiGe) and the semiconductor materials of the second residual portion 803 (e.g., Si). The second section 693' is formed on one side of the SiGe nanowire core structure $405_{Core}$ that faces away from the substrate 101.

In an embodiment, the second residual portion 803 of the second section 693' of the compound sheath layer is the same material as the another second layer 207 (e.g., Si layer) and has a thickness $Th_{803}$ of between 0.5 nm and 10 nm, or about 1 nm. In one embodiment, the second residual portion thickness $Th_{803}$ is 0.96 nm. The second residual portion 803 is spaced apart from the SiGe nanowire core structure $405_{Core}$ by the first diffusion interface 283 of the second section 693' of the compound sheath layer that is disposed on a side of the SiGe nanowire core structure $405_{Core}$ that faces away from the substrate 101.

The first section 695' and the second section 693' combine to form a compound sheath layer with the first residual portion 805 (e.g., Si) and second residual portion 803 (e.g., Si) forming an "all-in-one" Si cap for the SiGe nanowire core structure $405_{Core}$ (e.g., SiGe). The "all-in-one" Si cap allows for a more robust structure of the SiGe nanowires 605' during formation of p-type device (e.g., PFET 603) of FIG. 8.

The forgoing discussion describes a process for forming an n-type device (e.g., NFET 609) of a gate all around (GAA) transistor and p-type device (e.g., PFET 603) of a gate all around (GAA) transistor. In an embodiment, the horizontal nanowires NWs of NFET 609 and horizontal nanowires NWs of PFET 603 are formed to have substantially same diameters. In an embodiment, an "all-in-one" Si cap is formed around the second nanowire 405 of PFET 603.

As previously discussed, in an embodiment, a resulting multi-layer structure includes highly controlled diffusion interfaces interposed between opposing first and second layers of semiconductor materials. During the deposition of the first and second semiconductor layers, the process is controlled such that the inter-diffusion rate is managed to provide diffusion interfaces with abrupt Si/SiGe interfaces formed to a thickness of less than 2 nm, or between 0.05 nm-2 nm, or about 0.96 nm. The highly controlled interfaces and first and second layers provide a multi-layer structure with improved etching selectivity which helps to reduce etching loss by NW release and enable the formation of an "all-in-one" Si cap around SiGe nano-wires (NWs). In one embodiment, the multi-layer structure with improved etching selectivity enables the formation of horizontal GAA NWs having substantially same diameters.

In an embodiment, a method includes depositing a first layer on a substrate, the first layer including a first semiconductor material; and growing a second layer on the first layer, the second layer including a second semiconductor material being different from the first semiconductor material and the first and second layers forming a first stack, wherein the first stack includes a first diffusion interface between the first layer and the second layer, wherein the growing the second layer is performed at a temperature at or below 600° C. In an embodiment the depositing the first layer or the growing the second layer comprises using a first deposition process with a first precursor material; and wherein forming another one of the depositing the first layer or the growing the second layer comprises using a second deposition process with the first precursor material and a second precursor material. In an embodiment the first diffusion interface has a thickness that is greater than zero and less than or equal to 2 nm. In an embodiment the first precursor material is a silane based compound and the second precursor material is a germane based compound. In an embodiment the silane based compound is silicore. In an embodiment the germane based compound is dichlorogermane. In an embodiment the method further includes: depositing at least a second stack of semiconductor layers over the first stack, wherein depositing the second stack includes: depositing another first layer of the first semiconductor material on the second layer of the first stack; and growing another second layer of the second semiconductor material on the another first layer of the first semiconductor material, the second stack including another first diffusion interface between the another first layer and the another second layer, wherein the first stack and the second stack form a superlattice including a compound stack of alternating layers of the first semiconductor material and the second semiconductor material on a substrate; and constructing at least one stack of horizontal nanowires from the compound stack of alternating layers of the superlattice, wherein the constructing at least one stack comprises: patterning at least one fin from the compound stack of the superlattice; and removing one of the first layers and the second layers from the superlattice. In an embodiment the method further includes forming a gate all-around transistor from the at least one stack of horizontal nanowires.

In an embodiment, a method includes: depositing a first layer on a substrate by a first deposition process, the first layer including a first semiconductor material; growing a second layer on the first layer by a second deposition process, the second layer including a second semiconductor material, the second semiconductor material being different from the first semiconductor material, the first and second layers forming a first stack of alternating layers of the first and second semiconductor materials, wherein one of the first deposition process and the second deposition process comprises using a first precursor material, wherein the other one of the first deposition process and the second deposition process is performed at a temperature at or below 600° C. and comprises using the first precursor material and a second precursor material, wherein the first stack includes a first diffusion interface disposed between the first layer and the second layer, and wherein an abruptness of the first diffusion interface is greater than zero and less than or equal to 2 nm; constructing at least one nanowire from the first stack of alternating layers, wherein constructing the at least one nanowire includes: patterning the first stack; and removing one of the first semiconductor material and the second semiconductor material from the first stack, wherein the removing is performed such that the one of the first semiconductor material and the second semiconductor material is removed from the first stack and the other semiconductor material remains in the first stack. In an embodiment the abruptness of the first diffusion interface is less than or equal to 1 nm. In an embodiment the abruptness of the first diffusion interface is less than or equal to 0.96 nm. In an embodiment the at least one nanowire includes a semiconductor core structure and a sheath layer, the semiconductor core structure including the other semiconductor material that remains in the first stack and the sheath layer including the first diffusion interface, and wherein the removing is further performed such that a residual portion of the one of the first semiconductor material and the second semiconductor material remains in the first stack with the first diffusion interface and the other semiconductor material, the residual portion being silicon and the residual portion forming with the first diffusion interface the sheath layer as a silicon cap layer of the nanowire.

In an embodiment, a method includes: depositing layers of a first semiconductor material and layers of a second semiconductor material on a substrate to form a stack of layers of the first and second semiconductor materials, the second semiconductor material being different from the first semiconductor material, wherein the depositing layers includes alternating between depositing layers of the first semiconductor material and depositing layers of the second semiconductor material such that the stack of layers is formed as a superlattice of alternating layers of the first semiconductor material and the second semiconductor material on a substrate, wherein at least one of the layers of the first semiconductor material is deposited as a compound layer of the first semiconductor material, by: introducing a first precursor material and a second precursor material according to a first parameter profile, to deposit a first portion of the compound layer having a first concentration of a first component; introducing the first precursor material and the second precursor material according to a second parameter profile, to deposit a second portion of the compound layer on the first portion of the compound layer, the second portion of the compound layer having a second concentration of the first component larger than the first concentration of the first component; and introducing the first precursor material and the second precursor material according to a third parameter profile, to deposit a third portion of the compound layer on the second portion of the compound layer, the third portion of the compound layer having a third concentration of the first component smaller than the second concentration of the first component. In an embodiment the first semiconductor material comprises silicon germanium. In an embodiment the method further includes removing at least a portion of the second semiconductor material from between layers of the first semiconductor material to form a first nanowire. In an embodiment the method further includes performing a deposition process for introducing the first precursor material and the second precursor material according to the first parameter profile, the first parameter profile including performing the deposition process between about 650° C. and about 680° C. In an embodiment the method further includes performing a deposition process for introducing the first precursor material and the second precursor material according to the second parameter profile, the second parameter profile including performing the deposition process at or below 620° C. In an embodiment the first concentration is about 15%, the second concentration is about 50%, and the third concentration is about 15%. In an embodiment the second precursor material is a germane based compound and the first concentration of the first component is less than 20% Ge and the second concentration of the first component is greater than 20%. In an embodiment the superlattice further comprises diffusion interfaces disposed between each of the alternating layers of the first semiconducting material and the second semiconductor material, wherein an abruptness of at least one of the diffusion interfaces is greater than zero and less than or equal to 2 nm The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   depositing a first layer on a substrate, the first layer including a first semiconductor material; and
   growing a second layer on the first layer, the second layer including a second semiconductor material being different from the first semiconductor material and the first and second layers forming a first stack, wherein the first stack includes a first diffusion interface between the first layer and the second layer, wherein the first diffusion interface has a thickness that is greater than zero and less than or equal to 2 nanometers, wherein the depositing the first layer or the growing the second layer comprises using a first deposition process with a first precursor material, and wherein forming another one of the depositing the first layer or the growing the second layer comprises using a second deposition process with the first precursor material and a second precursor material.

2. The method of claim 1, wherein the growing the second layer is performed at a temperature at or below 600° C.

3. The method of claim 1, wherein the first precursor material is a silane based compound and the second precursor material is a germane based compound.

4. The method of claim 3, wherein the silane based compound is silicore.

5. The method of claim 4, wherein the germane based compound is dichlorogermane.

6. The method of claim 1, further comprising:
   depositing at least a second stack of semiconductor layers over the first stack, including:
      depositing another first layer of the first semiconductor material on the second layer of the first stack; and
      growing another second layer of the second semiconductor material on the another first layer of the first semiconductor material, the second stack including another first diffusion interface between the another first layer and the another second layer, wherein the first stack and the second stack form a superlattice including a compound stack of alternating layers of the first semiconductor material and the second semiconductor material on a substrate; and
   constructing at least one stack of horizontal nanowires from the compound stack of alternating layers of the superlattice, comprising:
      patterning at least one fin from the compound stack of the superlattice; and
      removing one of the first layers and the second layers from the superlattice.

7. The method claim 6, further comprising forming a gate all-around transistor from the at least one stack of horizontal nanowires.

8. The method of claim 1, further comprising forming a gate all-around transistor from the first layer and the second layer.

9. A method, comprising:
depositing a first layer on a substrate by a first deposition process, the first layer including a first semiconductor material;
growing a second layer on the first layer by a second deposition process, the second layer including a second semiconductor material, the second semiconductor material being different from the first semiconductor material, the first and second layers forming a first stack of alternating layers of the first and second semiconductor materials, wherein one of the first deposition process and the second deposition process comprises using a first precursor material, wherein the other one of the first deposition process and the second deposition process is performed at a temperature at or below 600° C. and comprises using the first precursor material and a second precursor material, wherein the first stack includes a first diffusion interface disposed between the first layer and the second layer, and wherein an abruptness of the first diffusion interface is greater than zero and less than or equal to 2 nanometers;
constructing at least one nanowire from the first stack of alternating layers, wherein constructing the at least one nanowire comprises:
patterning the first stack; and
removing one of the first semiconductor material and the second semiconductor material from the first stack, wherein the removing is performed such that the one of the first semiconductor material and the second semiconductor material is removed from the first stack and the other semiconductor material remains in the first stack.

10. The method of claim 9, wherein the abruptness of the first diffusion interface is less than or equal to 1 nanometer.

11. The method of claim 10, wherein the abruptness of the first diffusion interface is less than or equal to 0.96 nanometers.

12. The method of claim 9, wherein the at least one nanowire includes a semiconductor core structure and a sheath layer, the semiconductor core structure including the other semiconductor material that remains in the first stack and the sheath layer including the first diffusion interface, and wherein the removing is further performed such that a residual portion of the one of the first semiconductor material and the second semiconductor material remains in the first stack with the first diffusion interface and the other semiconductor material, the residual portion being silicon and the residual portion forming with the first diffusion interface the sheath layer as a silicon cap layer of the nanowire.

13. A method, comprising:
depositing layers of a first semiconductor material and layers of a second semiconductor material on a substrate to form a stack of layers of the first and second semiconductor materials, the second semiconductor material being different from the first semiconductor material, including alternating between depositing layers of the first semiconductor material and depositing layers of the second semiconductor material such that the stack of layers is formed as a superlattice of alternating layers of the first semiconductor material and the second semiconductor material on a substrate, wherein at least one of the layers of the first semiconductor material is deposited as a compound layer of the first semiconductor material, by:
introducing a first precursor material and a second precursor material according to a first parameter profile, to deposit a first portion of the compound layer having a first concentration of a first component;
introducing the first precursor material and the second precursor material according to a second parameter profile, to deposit a second portion of the compound layer on the first portion of the compound layer, the second portion of the compound layer having a second concentration of the first component larger than the first concentration of the first component; and
introducing the first precursor material and the second precursor material according to a third parameter profile, to deposit a third portion of the compound layer on the second portion of the compound layer, the third portion of the compound layer having a third concentration of the first component smaller than the second concentration of the first component.

14. The method of claim 13, wherein the first semiconductor material comprises silicon germanium.

15. The method of claim 13, further comprising removing at least a portion of the second semiconductor material from between layers of the first semiconductor material to form a first nanowire.

16. The method of claim 13, further comprising performing a deposition process for introducing the first precursor material and the second precursor material according to the first parameter profile, the first parameter profile including performing the deposition process between about 650° C. and about 680° C.

17. The method of claim 13, further comprising performing a deposition process for introducing the first precursor material and the second precursor material according to the second parameter profile, the second parameter profile including performing the deposition process at or below 620° C.

18. The method of claim 13, wherein the first concentration is about 15%, the second concentration is about 50%, and the third concentration is about 15%.

19. The method of claim 13, wherein the second precursor material is a germane based compound and the first concentration of the first component is less than 20% Ge and the second concentration of the first component is greater than 20%.

20. The method of claim 13, wherein the superlattice further comprises diffusion interfaces disposed between each of the alternating layers of the first semiconducting material and the second semiconductor material, wherein an abruptness of at least one of the diffusion interfaces is greater than zero and less than or equal to 2 nanometers.

* * * * *